(12) United States Patent
Kim et al.

(10) Patent No.: US 12,213,256 B2
(45) Date of Patent: Jan. 28, 2025

(54) SEMICONDUCTOR PACKAGE FOR IMPROVING POWER INTEGRITY CHARACTERISTICS

(71) Applicant: SAMSUNG ELECTRONICS CO., LTD., Suwon-si (KR)

(72) Inventors: Junghwa Kim, Seoul (KR); Junso Pak, Seongnam-si (KR); Heeseok Lee, Suwon-si (KR); Moonseob Jeong, Seongnam-si (KR); Jisoo Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 442 days.

(21) Appl. No.: 17/591,734

(22) Filed: Feb. 3, 2022

(65) Prior Publication Data

US 2022/0361339 A1 Nov. 10, 2022

(30) Foreign Application Priority Data

May 6, 2021 (KR) ........................ 10-2021-0058788

(51) Int. Cl.
*H01L 23/498* (2006.01)
*H01L 23/00* (2006.01)
(Continued)

(52) U.S. Cl.
CPC ........... *H05K 1/181* (2013.01); *H01L 23/481* (2013.01); *H01L 23/49816* (2013.01);
(Continued)

(58) Field of Classification Search
CPC ........... H01L 23/5386; H01L 23/49838; H01L 23/49844; H01L 24/97; H01L 2224/05011; H01L 2224/05551; H01L 2224/08237; H01L 2224/97; H01L 2224/16237; H01L 2224/24147; H01L 2224/24151; H01L 2224/24155; H01L 2224/24195; H01L 2224/24225; H01L 2224/24227;
(Continued)

(56) References Cited

U.S. PATENT DOCUMENTS 6,294,439 B1 9/2001 Sasaki et al.
6,906,414 B2 6/2005 Zhao et al.
(Continued)

*Primary Examiner* — Nicholas J Tobergte
*Assistant Examiner* — William Henry Anderson
(74) *Attorney, Agent, or Firm* — Muir Patent Law, PLLC

(57) ABSTRACT

A semiconductor package including a circuit board including a first wiring region, a die mounting region surrounding the first wiring region, and a second wiring region surrounding the die mounting region; a plurality of wiring balls on the first wiring region and the second wiring region and spaced apart from one another, the plurality of wiring balls including a plurality of first wiring balls on the first wiring region and a plurality of second wiring balls on the second wiring region; a die on the die mounting region, the die including a plurality of unit chips spaced apart from one another, and a die-through region corresponding to the first wiring region and exposing the first wiring balls; and a plurality of die balls on the die and the die mounting region, the plurality of die balls being spaced apart from one another and electrically coupled to the circuit board.

20 Claims, 26 Drawing Sheets

(51) Int. Cl.
*H01L 23/48* (2006.01)
*H01L 23/538* (2006.01)
*H05K 1/02* (2006.01)
*H05K 1/18* (2006.01)
*H01L 25/065* (2023.01)

(52) U.S. Cl.
CPC .......... *H01L 23/5386* (2013.01); *H01L 24/14* (2013.01); *H01L 24/16* (2013.01); *H01L 24/17* (2013.01); *H05K 1/0228* (2013.01); *H01L 25/0655* (2013.01); *H01L 2224/14135* (2013.01); *H01L 2224/16225* (2013.01); *H01L 2224/1712* (2013.01); *H01L 2924/1205* (2013.01); *H01L 2924/15311* (2013.01); *H05K 2201/10734* (2013.01)

(58) Field of Classification Search
CPC . H01L 2224/24265; H01L 2224/32237; H01L 2225/1041; H01L 2225/107; H01L 2924/1515; H01L 2924/15151; H01L 2924/19103; H01L 2924/19105; H05K 2201/09; H05K 2201/09009; H05K 2201/09036; H05K 2201/09063; H05K 2201/09072; H05K 2201/0969
See application file for complete search history.

(56) References Cited

U.S. PATENT DOCUMENTS

| | | | |
|---|---|---|---|
| 8,101,436 | B2 | 1/2012 | Takekoshi |
| 8,367,475 | B2 | 2/2013 | Law et al. |
| 8,963,339 | B2 | 2/2015 | He et al. |
| 9,026,872 | B2 | 5/2015 | Camarota |
| 9,165,833 | B2 | 10/2015 | Grivna et al. |
| 2003/0214029 | A1 | 11/2003 | Tao et al. |
| 2007/0278642 | A1* | 12/2007 | Yamaguchi ........... H01L 25/105 257/686 |
| 2009/0140415 | A1* | 6/2009 | Furuta ................. H05K 3/4614 257/700 |
| 2010/0237483 | A1* | 9/2010 | Chi ....................... H01L 25/105 257/E23.116 |
| 2015/0303170 | A1 | 10/2015 | Kim et al. |
| 2018/0158768 | A1* | 6/2018 | Kim ................... H01L 23/49811 |
| 2018/0175001 | A1* | 6/2018 | Pyo ........................ H01L 25/50 |
| 2018/0261569 | A1* | 9/2018 | Yang .................... H01L 25/0652 |
| 2022/0077065 | A1* | 3/2022 | Kuan ..................... H01L 23/13 |

* cited by examiner

SEMICONDUCTOR PACKAGE FOR IMPROVING POWER INTEGRITY CHARACTERISTICS

CROSS-REFERENCE TO RELATED APPLICATION

This application is based on and claims priority under 35 U.S.C. § 119 to Korean Patent Application No. 10-2021-0058788, filed on May 6, 2021, in the Korean Intellectual Property Office, the disclosure of which is incorporated by reference herein in its entirety.

BACKGROUND

1. Field

Embodiments relate to a semiconductor package for improving power integrity (PI) characteristics.

2. Description of the Related Art

In a semiconductor package, a die, such as an integrated circuit device or a passive element, may be mounted on a circuit board. Whether a voltage is transmitted to a die mounted on a circuit board without adding noise may depend on PI characteristics.

SUMMARY

The embodiments may be realized by providing a semiconductor package including a circuit board including a first wiring region, a die mounting region surrounding the first wiring region, and a second wiring region surrounding the die mounting region; a plurality of wiring balls on the first wiring region and the second wiring region and spaced apart from one another, the plurality of wiring balls including a plurality of first wiring balls on the first wiring region and a plurality of second wiring balls on the second wiring region; a die on the die mounting region, the die including a plurality of unit chips spaced apart from one another, and a die-through region corresponding to the first wiring region and exposing the plurality of first wiring balls; and a plurality of die balls on the die and the die mounting region, the plurality of die balls being spaced apart from one another and electrically coupled to the circuit board.

The embodiments may be realized by providing a semiconductor package including a circuit board including a first wiring region, a die mounting region surrounding the first wiring region, an underfill placement region surrounding the first wiring region and the die mounting region, and a second wiring region surrounding the underfill placement region; a plurality of wiring balls on the first wiring region and the second wiring region and spaced apart from one another, the plurality of wiring balls including a plurality of first wiring balls on the first wiring region and a plurality of second wiring balls on the second wiring region; a die on the die mounting region, the die including a plurality of unit chips spaced apart from one another, each unit chip of the plurality of unit chips including a passive element having a decoupling capacitor, and a die-through region corresponding to the first wiring region and exposing the plurality of first wiring balls; and a plurality of die balls on the die and on the die mounting region, the plurality of die balls being spaced apart from one another and electrically coupled to the circuit board.

The embodiments may be realized by providing a semiconductor package including a circuit board having a first wiring surface and a second wiring surface opposite to the first wiring surface, the circuit board including a first wiring region on the first wiring surface, a die mounting region surrounding the first wiring region, an underfill placement region surrounding the first wiring region and the die mounting region, and a second wiring region surrounding the underfill placement region; a plurality of wiring balls on the first wiring surface and spaced apart from one another, the plurality of wiring balls including a plurality of first wiring balls on the first wiring region and a plurality of second wiring balls on the second wiring region, the plurality of wiring balls being electrically connected to a power wiring line or ground wiring line; a first die having a first die surface corresponding to the first wiring surface and a second die surface opposite to the first die surface and on the die mounting region, the first die including a plurality of unit chips spaced apart from one another and a die-through region corresponding to the first wiring region and exposing the plurality of first wiring balls; a plurality of first die balls on the first die surface and spaced apart from one another, the plurality of first die balls being electrically coupled to the circuit board; and a second die on the second wiring surface and electrically coupled to the circuit board via a plurality of second die balls.

BRIEF DESCRIPTION OF THE DRAWINGS

Features will be apparent to those of skill in the art by describing in detail exemplary embodiments with reference to the attached drawings in which.

DETAILED DESCRIPTION

In the present specification, singular forms of components may include plural forms unless the context clearly indicates otherwise. In the present specification, the drawings may be exaggeratedly illustrated to more clearly explain the embodiments.

Figure 1:
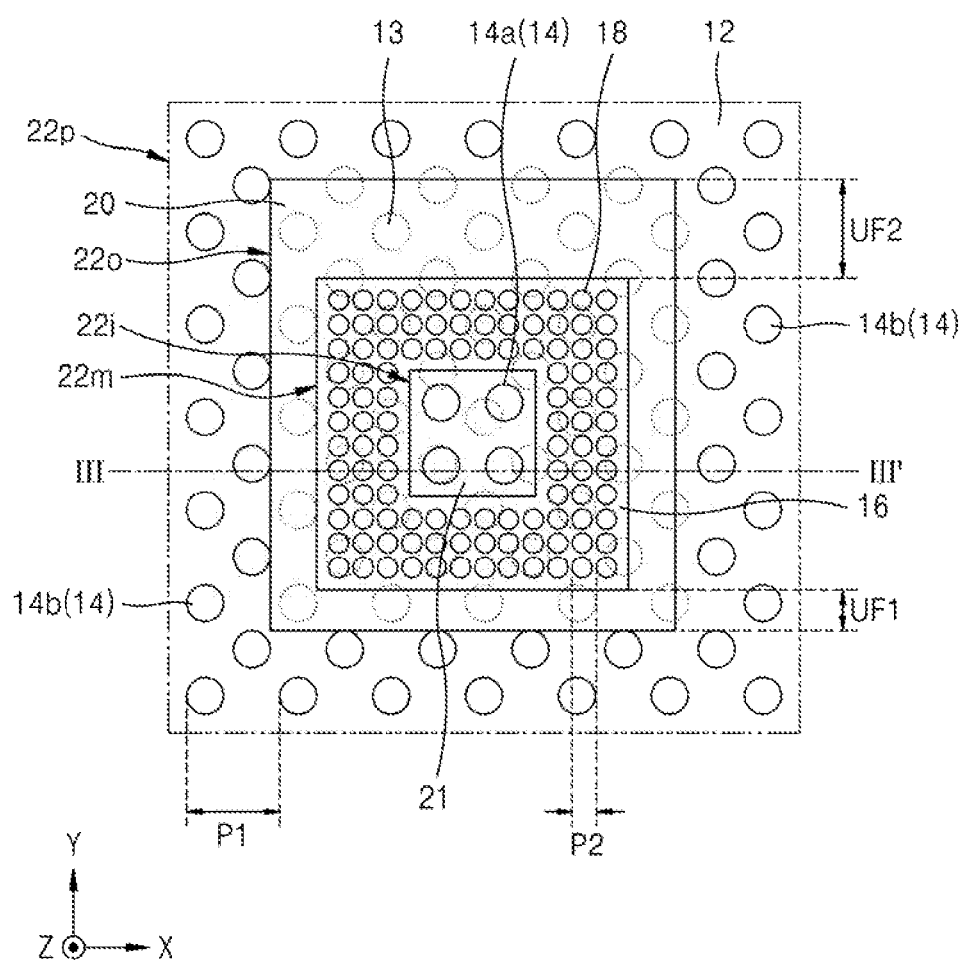
FIG. 1 is a layout diagram of a semiconductor package according to an embodiment.
Figure 2:
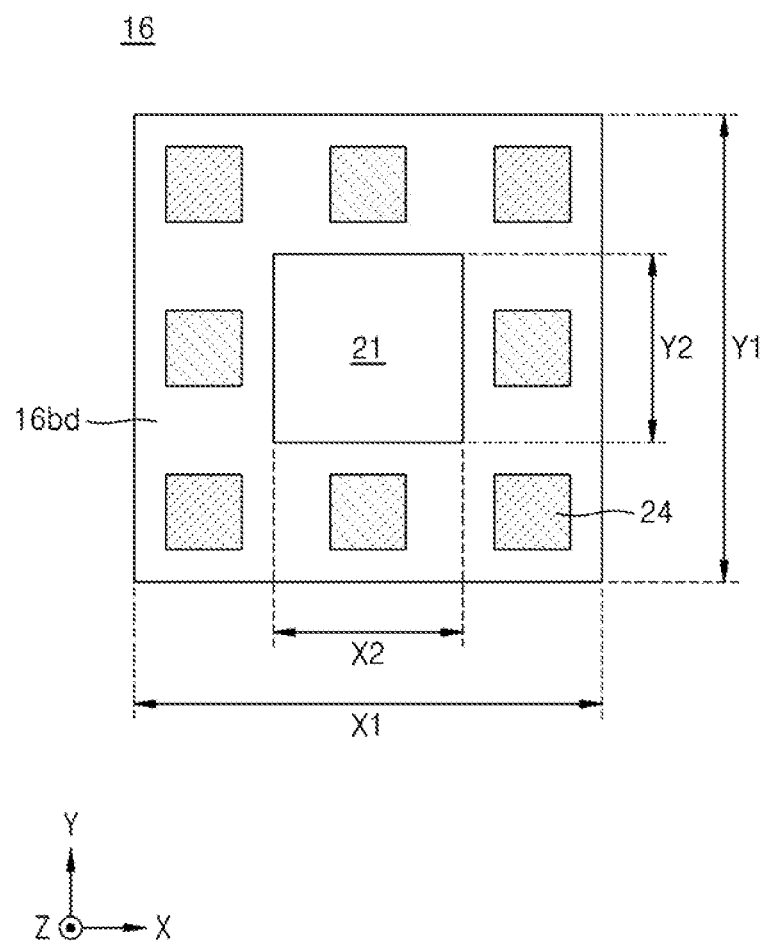
FIG. 2 is a plan view of a die of FIG. 1.

FIG. 1 is a layout diagram of a semiconductor package 10 according to an embodiment, and FIG. 2 is a plan view of a die 16 shown in FIG. 1.

In an implementation, the semiconductor package 10 may include a circuit board 12, a plurality of wiring balls 14, the die 16, and a plurality of die balls 18. The circuit board 12 may be, e.g., a printed circuit board (PCB) or an interposer substrate.

In an implementation, the circuit board 12 may include a first wiring region 22i, a die mounting region 22m surrounding the first wiring region 22i, an underfill placement region 22o surrounding the first wiring region 22i and the die mounting region 22m, and a second wiring region 22p surrounding the underfill placement region 22o.

An area of the first wiring region 22i may be less than an area of the die mounting region 22m. The first wiring region 22i may be at a central portion of the circuit board 12. The underfill placement region 22o or the second wiring region 22p may be at a periphery of the circuit board 12 (e.g., outward relative to the die mounting region 22m).

Outermost edges of the underfill placement region 22o may be different distances from outermost edges of the die mounting region 22m. In an implementation, a lowermost (e.g., as illustrated in FIG. 1) edge of the underfill placement region 22o may be a first distance UF1 in the −Y direction away from a corresponding (e.g., facing or closest) outermost edge of the die mounting region 22m.

An uppermost (e.g., as illustrated in FIG. 1) edge of the underfill placement region 22o may be at a second distance UF2 in the Y direction from a corresponding outermost edge of the die mounting region 22m. The first distance UF1 may be different from the second distance UF2. In an implementation, the second distance UF2 may be greater than the first distance UF1.

In an implementation, the underfill placement region 22o may not be omitted. In this case, the circuit board 12 may include the second wiring region 22p surrounding the die mounting region 22m (e.g., the second wiring region 22p may be directly outside of or directly contact the die mounting region 22m).

As shown in FIG. 1, a plurality of the wiring balls 14 may be spaced apart from one another in the X-Y plane on the circuit board 12. Reference numeral 14 denotes the wiring balls 14 in the present embodiment, and the wiring balls 14 may also be referred to as solder balls, solder bumps, wiring bumps, or wiring pads. The wiring balls 14 may be connected to a power (power supply) wiring line, a ground (earth) wiring line, or a signal wiring line in the circuit board 12.

The wiring balls 14 may include a plurality of first wiring balls 14a on the first wiring region 22i and a plurality of second wiring balls 14b on the second wiring region 22p. The first wiring balls 14a may be arranged in a straight line in the X direction and the Y direction.

The second wiring balls 14b may be arranged in a zigzag pattern in the Y direction. The first and second wiring balls 14a and 14b may be spaced apart (e.g., in the X direction) at a first pitch P1. The first pitch P1 may range from several micrometers (μm) to several tens of μm.

In an implementation, the number of first wiring balls 14a may be four (4), or more or fewer first wiring balls 14a may be arranged as desired. In FIG. 1, wiring balls 13 on the circuit board 12 according to an initial design and then removed are indicated by dashed lines.

The semiconductor package 10 may include the die 16 on the die mounting region 22m. The die 16 may be attached to the die mounting region 22m. The die 16 may include a plurality of unit chips 24 spaced apart from one another as shown in FIG. 2. In an implementation, each of the unit chips 24 may be an integrated circuit device or a passive element. The passive element may be a decoupling capacitor.

Referring to FIG. 2, the die 16 may include a die body region 16bd and a die-through region 21 within the die body region 16bd. The die body region 16bd and the die-through region 21 may each have a quadrangular shape. In an implementation, as will be described in greater detail below, the die body region 16bd and the die-through region 21 may each have a polygonal shape, e.g., a triangular or pentagonal shape.

In an implementation, the die body region 16bd may have lengths of X1 and Y1 in the X and Y directions, respectively. The lengths of X1 and Y1 may be equal to or different from each other. The lengths of X1 and Y1 may range from several millimeters (mm) to several tens of mm. The die-through region 21 may have lengths of X2 and Y2 in the X and Y directions, respectively. The lengths of X2 and Y2 may be equal to or different from each other. The lengths of X2 and Y2 may range from several mm to several tens of mm.

The die 16 may include the die-through region 21 corresponding to (e.g., overlying or aligned with) the first wiring region 22i and exposing the first wiring balls 14a. In the semiconductor package 10 according to an embodiment, the die 16 may include the unit chips 24 and the die-through region 21 to reduce the number of wiring balls 13 to be removed from the circuit board 12.

In an implementation, in the semiconductor package 10, the first wiring balls 14a exposed in the die-through region 21 may help improve characteristics (e.g., PI characteristics) of power transmitted to the circuit board 12 or the die 16 mounted on the circuit board 12.

The semiconductor package 10 may include a plurality of die balls 18 on the die 16 corresponding to the die mounting region 22m and spaced apart from one another. The die balls 18 may be electrically coupled to the circuit board 12. The die balls 18 may be connected to a power (power supply) wiring line, a ground (earth) wiring line, or a signal wiring line in the circuit board 12. Reference numeral 18 denotes the die balls 18 in this embodiment, and the die balls 18 may also be referred to as die solder balls, die solder bumps, die bumps, or die pads.

The die balls 18 may be spaced apart from one another on the X-Y plane. The die balls 18 may be spaced apart by a second pitch P2. The second pitch P2 may range from several μm to several tens of μm. The second pitch P2 may be less than the first pitch P1 of the first and second wiring balls 14a and 14b. A diameter of each of the die balls 18 may be less than a diameter of each of the wiring balls 14.

The semiconductor package 10 may include an underfill member 20 on the underfill placement region 22o surrounding the die mounting region 22m. The underfill member 20 may be below the die 16 (e.g., between the die 16 and the circuit board 12). In an implementation, the underfill member 20 may also be on the first wiring region 22*i*. In an implementation, the underfill member 20 may be omitted.

Figure 3:
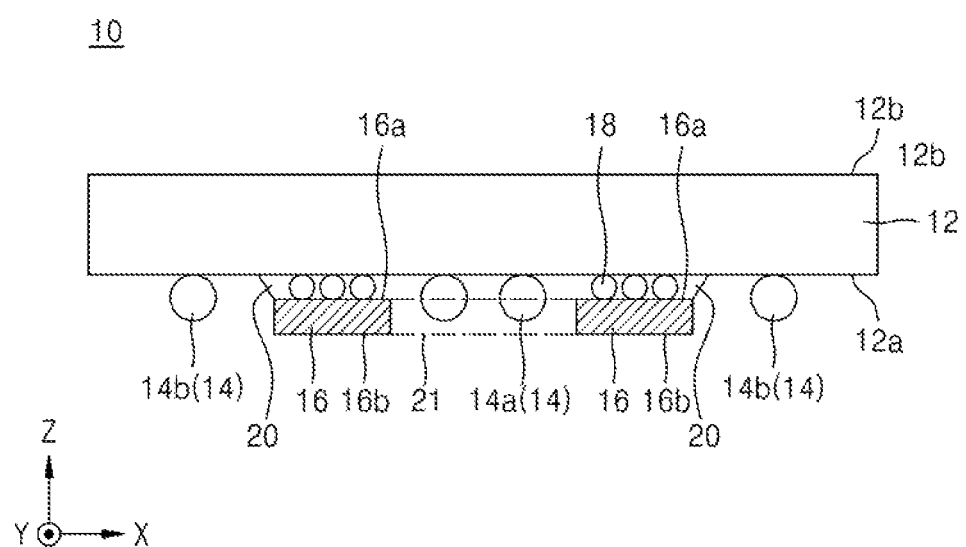
FIG. 3 is a cross-sectional view of a semiconductor package taken along line III-III' of FIG. 1.

FIG. 3 is a cross-sectional view of the semiconductor package 10 taken along line III-III' of FIG. 1.

FIG. 3 is a cross-sectional view of the semiconductor package 10 of FIG. 1 taken in the X-Z direction. The semiconductor package 10 may include the circuit board 12. The circuit board 12 may include a first wiring surface 12*a* and a second wiring surface 12*b* opposite to the first wiring surface 12*a*. The first wiring surface 12*a* and the second wiring surface 12*b* may be a lower surface and an upper surface of the circuit board 12, respectively.

The first wiring region 22*i*, the die mounting region 22*m*, the underfill placement region 22*o*, and the second wiring region 22*p* shown in FIG. 1 may be on the first wiring surface 12*a*. The wiring balls 14 (spaced apart from one another) may be on the first wiring surface 12*a*.

The wiring balls 14 may include the first wiring balls 14*a* and the second wiring balls 14*b*. The first wiring balls 14*a* may be at a central portion of the circuit board 12. The second wiring balls 14*b* may be at a periphery of the circuit board 12. The first and second wiring balls 14*a* and 14*b* may be connected to a power (power supply) wiring line, a ground (earth) wiring line, or a signal wiring line in the circuit board 12.

In an implementation, the first wiring balls 14*a* may be electrically connected to the power wiring line or ground wiring line in the circuit board 12. The semiconductor package 10 may exhibit improved characteristics (i.e., PI characteristics) of power transmitted to the circuit board 12 through the first wiring balls 14*a* arranged at the central portion of the circuit board 12.

The die 16 of the semiconductor package 10 may include a first die surface 16*a* and a second die surface 16*b* opposite to the first die surface 16*a*. The first die surface 16*a* and the second die surface 16*b* may be an upper face and a lower face of the die 16, respectively. The die balls 18 may be on the first die surface 16*a*. The die 16 may be electrically coupled to the circuit board 12 via the die balls 18.

The die 16 may include the die-through region 21 exposing the first wiring balls 14*a*. The die-through region 21 may be a region penetrating between the first and second die surfaces 16*a* and 16*b* of the die 16. The first wiring balls 14*a* may be exposed to outside through the die-through region 21.

The semiconductor package 10 may include the underfill member 20 attaching the die 16 to the circuit board 12. The underfill member 20 may be adjacent to the die 16 and between the first wiring surface 12*a* and the first die surface 16*a*. In an implementation, the underfill member 20 may also be between the first wiring balls 14*a* on the first wiring surface 12*a* of the circuit board 12. In an implementation, the underfill member 20 may be omitted.

Figure 4A:
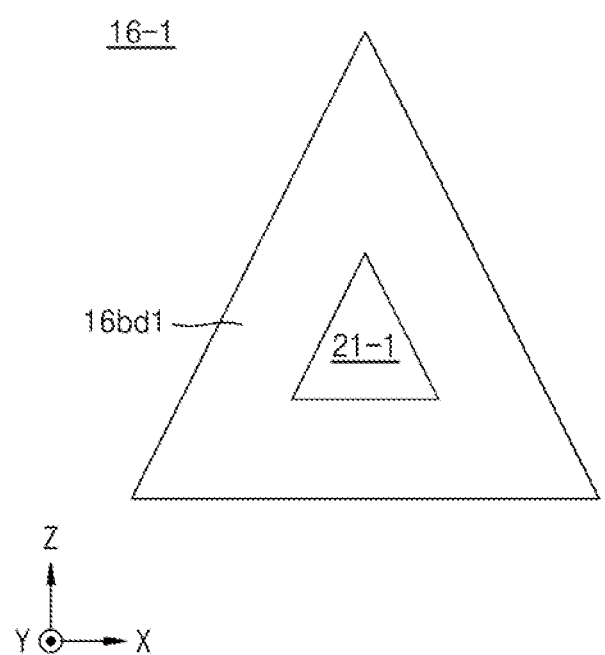
FIGS. 4A through 4C are plan views of dies according to embodiments.
Figure 4B:
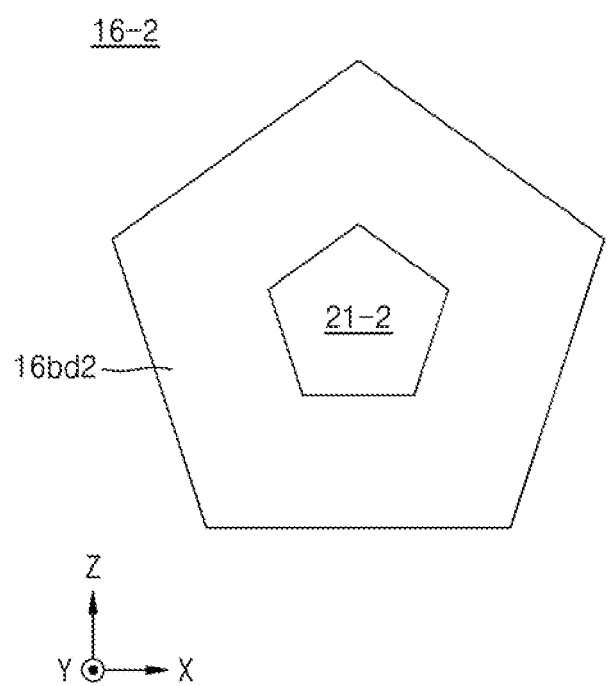
Figure 4C:
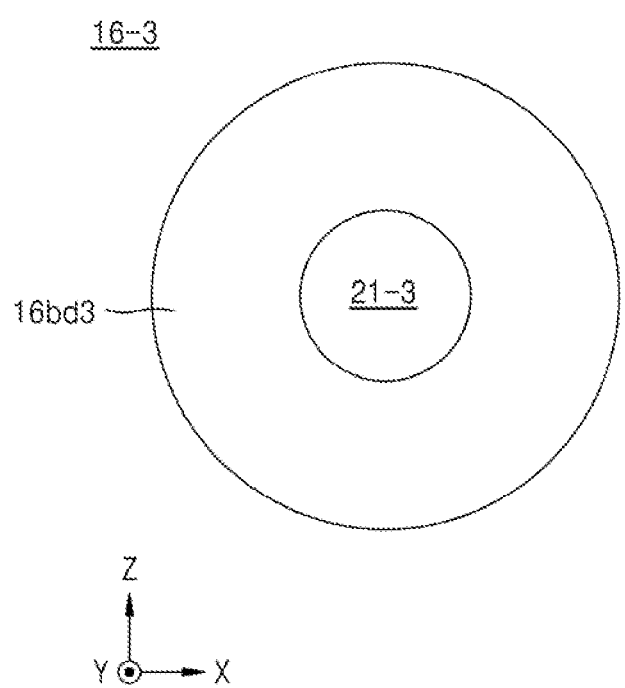

FIGS. 4A through 4C are plan views of dies 16-1, 16-2, and 16-3 according to embodiments.

In an implementation, the dies 16-1, 16-2, and 16-3 of FIGS. 4A through 4C may be various examples applicable to the semiconductor package 10 of FIGS. 1 through 3.

Referring to FIG. 4A, the die 16-1 may include a die body region 16*bd*1, and a die-through region 21-1 within the die body region 16*bd*1. The die body region 16*bd*1 and the die-through region 21-1 may each have a triangular shape.

Referring to FIG. 4B, the die 16-2 may include a die body region 16*bd*2, and a die-through region 21-2 within the die body region 16*bd*2. The die body region 16*bd*2 and the die-through region 21-2 may each have a pentagonal shape.

In an implementation, as illustrated in FIGS. 4A and 4B the die body region 16*d*1 and the die-through region 21-1 may be triangular in shape and the die body region 16*d*2 and the die-through region 21-2 may be pentagonal in shape, or they may also have other polygonal shapes such as a hexagonal shape.

In an implementation, referring to FIG. 4C, the die 16-3 may include a die body region 16*bd*3, and a die-through region 21-3 within the die body region 16*bd*3. The die body region 16*bd*3 and the die-through region 21-3 may each have a circular shape and form a doughnut-shaped region as a whole (e.g., may have concentric circular shapes).

Figure 5:
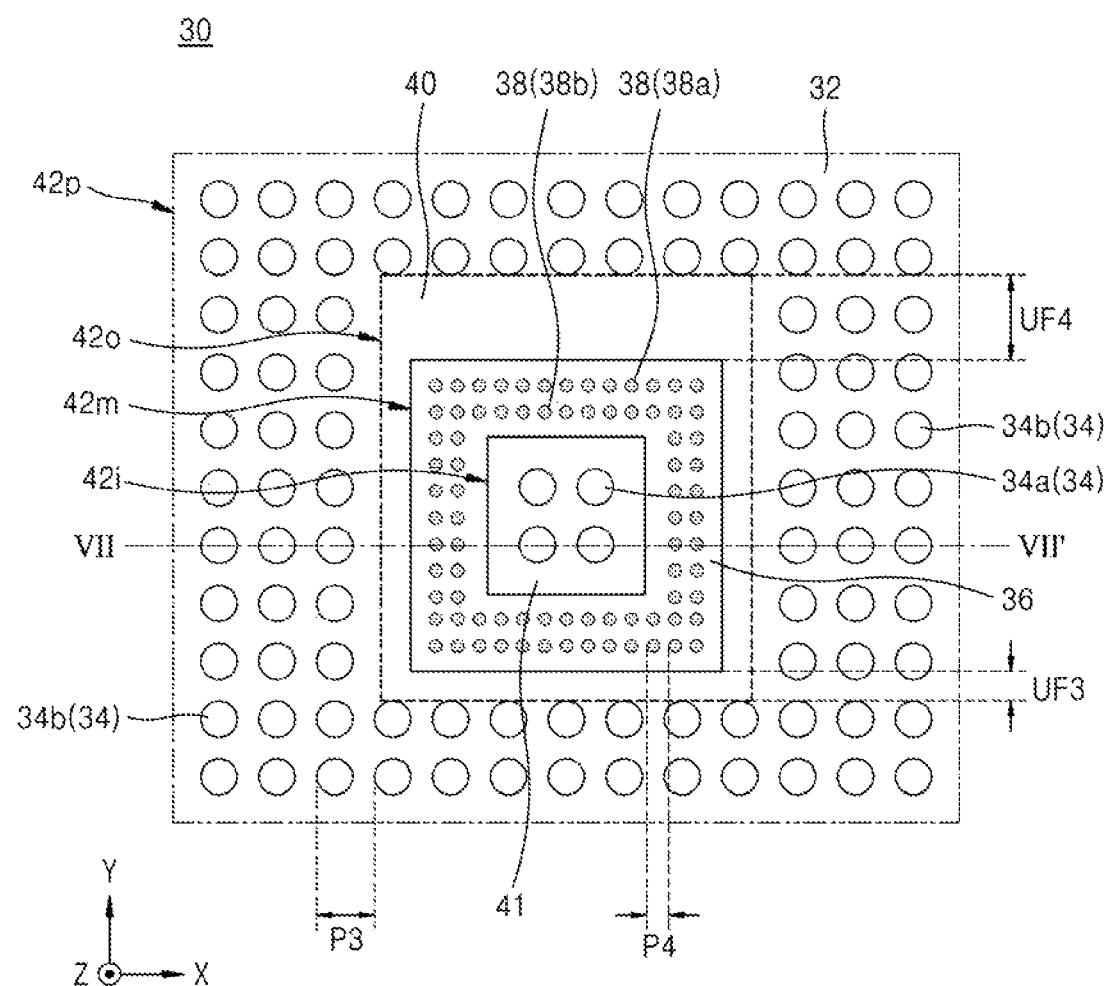
FIG. 5 is a layout diagram of a semiconductor package according to an embodiment.
Figure 6:
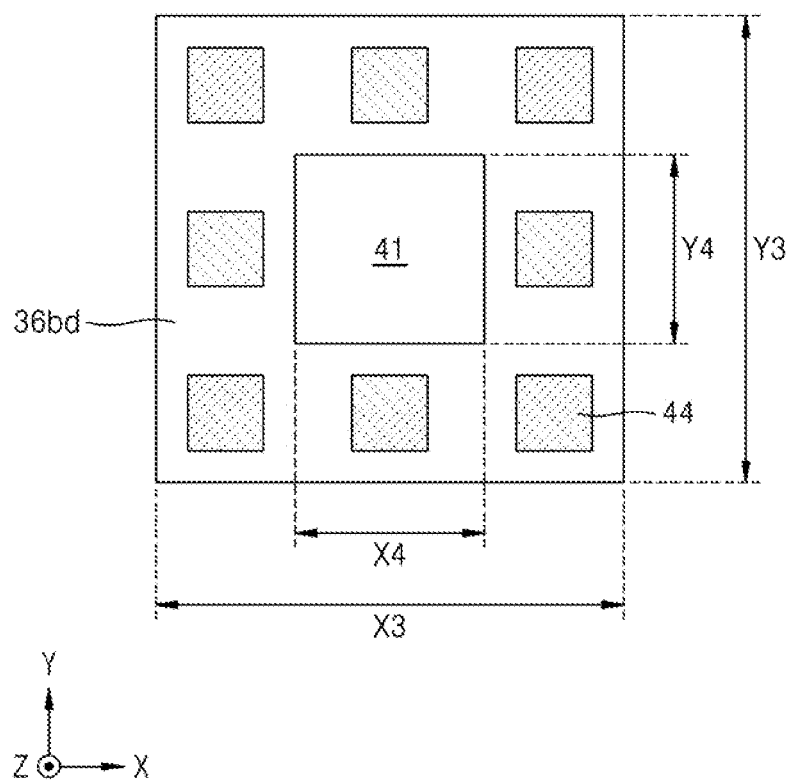
FIG. 6 is a plan view of a die of FIG. 5.

FIG. 5 is a layout diagram of a semiconductor package 30 according to an embodiment, and FIG. 6 is a top view of a die 36 of FIG. 5.

In an implementation, the semiconductor package 30 of FIGS. 5 and 6 may be substantially the same as the semiconductor package 10 of FIGS. 1 and 2 except the die 36 may include passive elements and may have a different arrangement or configuration of wiring balls 34 and die balls 38. In relation to FIGS. 5 and 6, descriptions that are already provided above with respect to FIGS. 1 and 2 may be briefly presented or omitted.

The semiconductor package 30 may include a circuit board 32, a plurality of wiring balls 34, the die 36, and a plurality of die balls 38. The circuit board 32 may be a PCB or an interposer substrate.

The circuit board 32 may correspond or be similar to the circuit board 12 described above with reference to FIG. 1. In an implementation, the circuit board 32 may include a first wiring region 42*i*, a die mounting region 42*m* surrounding the first wiring region 42*i*, an underfill placement region 42*o* surrounding the first wiring region 42*i* and the die mounting region 42*m*, and a second wiring region 42*p* surrounding the underfill placement region 42*o*.

An area of the first wiring region 42*i* may be less than an area of the die mounting region 42*m*. The first wiring region 42*i* may be at a central portion of the circuit board 32. The underfill placement region 42*o* or the second wiring region 42*p* may be arranged at a periphery of the circuit board 32 (e.g., outward relative to the first wiring region 42*i*).

Edges of the underfill placement region 42*o* may be at different distances from outermost edges of the die mounting region 42*m*. In an implementation, one (e.g., bottom) edge of the underfill placement region 42*o* may be a third distance UF3 in the −Y direction from a corresponding (e.g., facing, adjacent, or nearest) outermost edge of the die mounting region 42*m*.

Another (e.g., top) edge of the underfill placement region 42*o* may be a fourth distance UF4 in the Y direction away from a corresponding outermost edge of the die mounting region 42*m*. The third distance UF3 may be different from the fourth distance UF4. The fourth distance UF4 may be greater than the third distance UF3.

In an implementation, the underfill placement region 42*o* may be omitted. In this case, the circuit board 32 may include the second wiring region 42*p* immediately surrounding the die mounting region 42*m*.

A plurality of wiring balls 34 (spaced apart from one another in the X-Y plane) may be on the circuit board 32. The wiring balls 34 may correspond to the wiring balls 14 described with reference to FIG. 1. In an implementation, the wiring balls 34 may also be referred to as solder balls, solder bumps, wiring bumps, or wiring pads. The wiring balls 34 may be connected to a power (power supply) wiring line, a ground (earth) wiring line, or a signal wiring line in the circuit board 32.

The wiring balls 34 may include a plurality of first wiring balls 34a on the first wiring region 42i and a plurality of second wiring balls 34b on the second wiring region 42p. The first and second wiring balls 34a and 34b may be arranged in a straight line in X and Y directions. The first and second wiring balls 34a and 34b may each be spaced apart at a third pitch P3. The third pitch P3 may range from several μm to several tens of μm.

The semiconductor package 30 may include the die 36 on the die mounting region 42m. The die 36 may be attached to the die mounting region 42m. The die 36 may correspond to the die 16 described above with reference to FIGS. 1 and 2.

The die 36 may include a plurality of passive elements. In an implementation, the die 36 may include a plurality of unit chips 44 spaced apart from one another as shown in FIG. 6. Each of the unit chips 44 may be a passive element. The passive element may be a decoupling capacitor.

Referring to FIG. 6, the die 36 may include a die body region 36bd and a die-through region 41 within the die body region 36bd. The die body region 36bd and the die-through region 41 may each have a quadrangular shape.

In an implementation, the die body region 36bd may have lengths of X3 and Y3 in the X and Y directions, respectively. The lengths of X3 and Y3 may be equal to or different from each other. The lengths of X3 and Y3 may range from several mm to several tens of mm. The die-through region 41 may have lengths of X4 and Y4 in the X and Y directions, respectively. The lengths of X4 and Y4 may be equal to or different from each other. The lengths of X4 and Y4 may range from several mm to several tens of mm.

The die 36 may include the die-through region 41 corresponding to or aligned with the first wiring region 42i and exposing the first wiring balls 34a. In the semiconductor package 30 according to an embodiment, the die 36 may include the unit chips 44 and the die-through region 41 to help reduce the number of wiring balls to be removed from the circuit board 32.

In an implementation, in the semiconductor package 30, the first wiring balls 34a exposed in the die-through region 41 may help improve characteristics (i.e., PI characteristics) of power transmitted to the circuit board 32 or the die 36 mounted on the circuit board 32.

The semiconductor package 30 may include a plurality of die balls 38 spaced apart from one another on the die 36 and corresponding to or on the die mounting region 42m. The die balls 38 may be electrically coupled to the circuit board 32. The die balls 38 may correspond to the die balls 18 described with reference to FIG. 1. In an implementation, the die balls 38 may also be referred to as die solder balls, die solder bumps, die bumps, or die pads.

The die balls 38 may include a plurality of first die balls 38a and a plurality of second die balls 38b. The first die balls 38a may be electrically connected to a power (power supply) wiring line in the circuit board 32, and the second die balls 38b may be electrically connected to a ground (earth) wiring line therein. The first die balls 38a may be power connecting balls, and the second die balls 38b may be ground connecting balls.

The die balls 38 may be spaced apart from one another on the X-Y plane. The die balls 38 may be spaced apart by a fourth pitch P4. The fourth pitch P4 may range from several μm to several tens of μm. The fourth pitch P4 may be less than the third pitch P3 of the first and second wiring balls 34a and 34b. A diameter of each of the die balls 38 may be less than a diameter of each of the wiring balls 34.

The semiconductor package 30 may include an underfill member 40 on the underfill placement region 42o surrounding the die mounting region 42m. The underfill member 40 may be below the die 36 (e.g., between the die and the circuit board 32). In an implementation, the underfill member 40 may also be on the first wiring region 42i. In an implementation, the underfill member 40 may be omitted.

Figure 7:
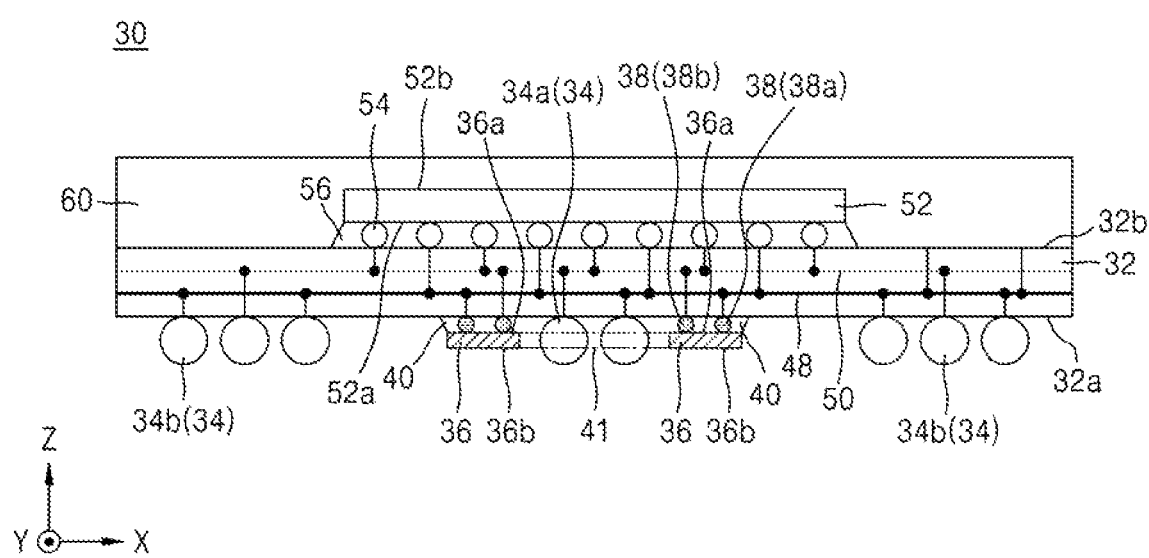
FIG. 7 is a cross-sectional view of a semiconductor package taken along line VII-VII' of FIG. 5.
Figure 8:
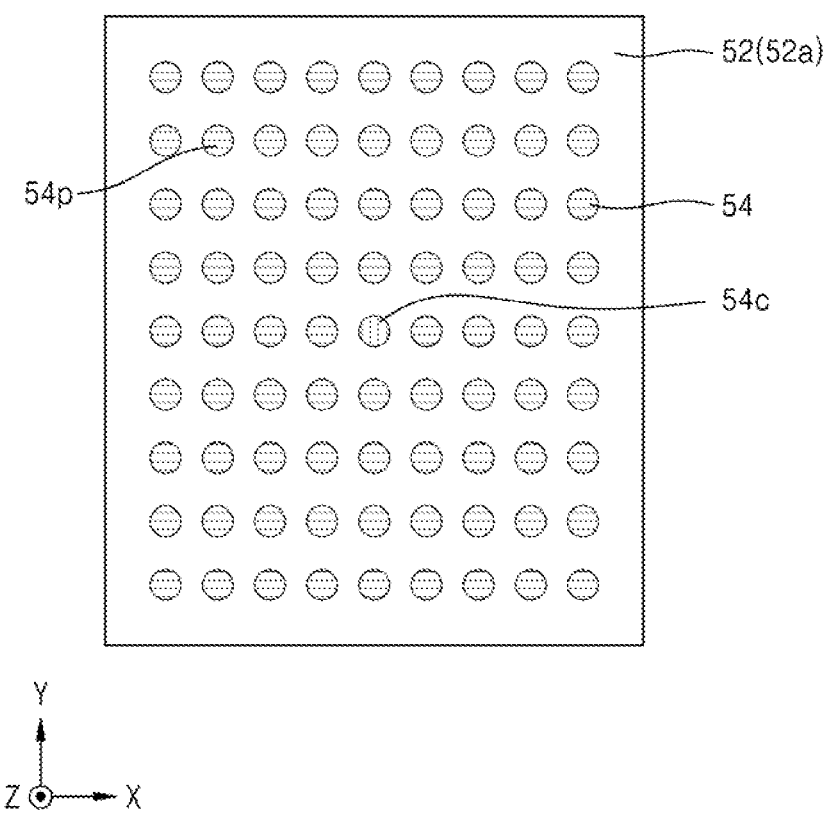
FIG. 8 is a plan view of third die balls arranged on a second die of FIG. 7.

FIG. 7 is a cross-sectional view of the semiconductor package 30 taken along line VII-VII' of FIG. 5, and FIG. 8 is a plan view of third die balls 54 on a second die 52 of FIG. 7.

FIG. 7 is a cross-sectional view of the semiconductor package 30 taken in the X-Z direction of FIG. 5. FIG. 8 is a bottom plan view of the second die 52 having the third die balls 54 of FIG. 7 thereon.

The semiconductor package 30 may include the circuit board 32. The circuit board 32 may include a first wiring surface 32a and a second wiring surface 32b opposite to the first wiring surface 32a. In an implementation, the first wiring surface 32a and the second wiring surface 32b may be a lower surface and an upper surface of the circuit board 32, respectively.

The first wiring region 42i, the die mounting region 42m, the underfill placement region 42o, and the second wiring region 42p shown in FIG. 5 may be on the first wiring surface 32a. The wiring balls 34 spaced apart from one another may be on the first wiring surface 32a.

The wiring balls 34 may include the first wiring balls 34a and the second wiring balls 34b. The first wiring balls 34a may be at a central portion of the circuit board 32. The second wiring balls 34b may be at a periphery of the circuit board 32.

The first and second wiring balls 34a and 34b may be respectively connected to a power wiring line 48, a ground wiring line 50, or a signal wiring line in the circuit board 32. In an implementation, the semiconductor package 30 may exhibit improved characteristics (i.e., PI characteristics) of power transmitted to the circuit board 32 through the first wiring balls 34a at the central portion of the circuit board 32.

The semiconductor package 30 may include the die 36. The die 36 may be also referred to as a first die. The die 36 may include a first die surface 36a and a second die surface 36b opposite to the first die surface 36a. In an implementation, the first die surface 36a and the second die surface 36b may be an upper surface and a lower surface of the die 36, respectively. The die balls 38 may be on the first die surface 36a of the die 36. The die 36 may be electrically coupled to the circuit board 32 via the die balls 38.

The die balls 38 may include the first die balls 38a and the second die balls 38b. The first die balls 38a may be electrically connected to the power wiring line 48 in the circuit board 32, and the second die balls 38b may be electrically connected to the ground wiring line 50 therein. The first die balls 38a may be power connecting balls, and the second die balls 38b may be ground connecting balls.

The die 36 may include the die-through region 41 exposing the first wiring balls 34a. The die-through region 41 may be a region penetrating between the first and second die surfaces 36a and 36b of the die 36. The first wiring balls 34a may be exposed to outside through the die-through region 41.

The semiconductor package 30 may include the underfill member 40 attaching the die 36 to the circuit board 32. The underfill member 40 may be adjacent to the die 36 and between the first wiring surface 32a and the first die surface 36a. In an implementation, the underfill member 40 may also be between the first wiring balls 34a on the first wiring surface 32a of the circuit board 32. In an implementation, the underfill member 40 may be omitted.

The semiconductor package 30 may include the second die 52 on the second wiring surface 32b of the circuit board 32. In an implementation, the second die 52 may be an integrated circuit device. In an implementation, the second die 52 may be a logic device or a memory device. The logic device may be, e.g., a memory controller, a central processing unit (CPU), a graphics processing unit (GPU), or an application processor (AP).

The memory device may be, e.g., dynamic random access memory (DRAM), static RAM (SRAM), flash memory, electrically erasable and programmable read-only memory (EEPROM), and phase-change RAM (PRAM), magnetic random access memory (MRAM), or resistive RAM (RRAM).

The second die 52 may include a third die surface 52a and a fourth die surface 52b opposite to the third die surface 52a. In an implementation, the third die surface 52a and the fourth die surface 52b may be a lower surface and an upper surface of the second die 52, respectively. The third die surface 52a may be opposite to, e.g., may face, the second wiring surface 32b of the circuit board 32.

A plurality of third die balls 54 (spaced apart from one another) may be on the third die surface 52a of the second die 52. The second die 52 may be electrically coupled to the circuit board 32 via the third die balls 54 on one surface of the second die 52. In an implementation, as shown in FIG. 8, the third die balls 54 may be spaced apart from one another in the X-Y plane. The third die balls 54 may include a third central die ball 54c at a central portion of the second die 52 and third peripheral die balls 54p at a periphery of the second die 52.

In an implementation, an underfill member 56 may be both between the third die surface 52a of the second die 52 and the second wiring surface 32b of the circuit board 32 and between the third die balls 54. In an implementation, the underfill member 56 may be omitted. The second die 52 may be molded using a molding material 60 on the second wiring surface 32b of the circuit board 32. The molding material 60 may be placed to mold the second die 52 on the second wiring surface 32b of the circuit board 32. In an implementation, the molding material 60 may be omitted.

Figure 9:
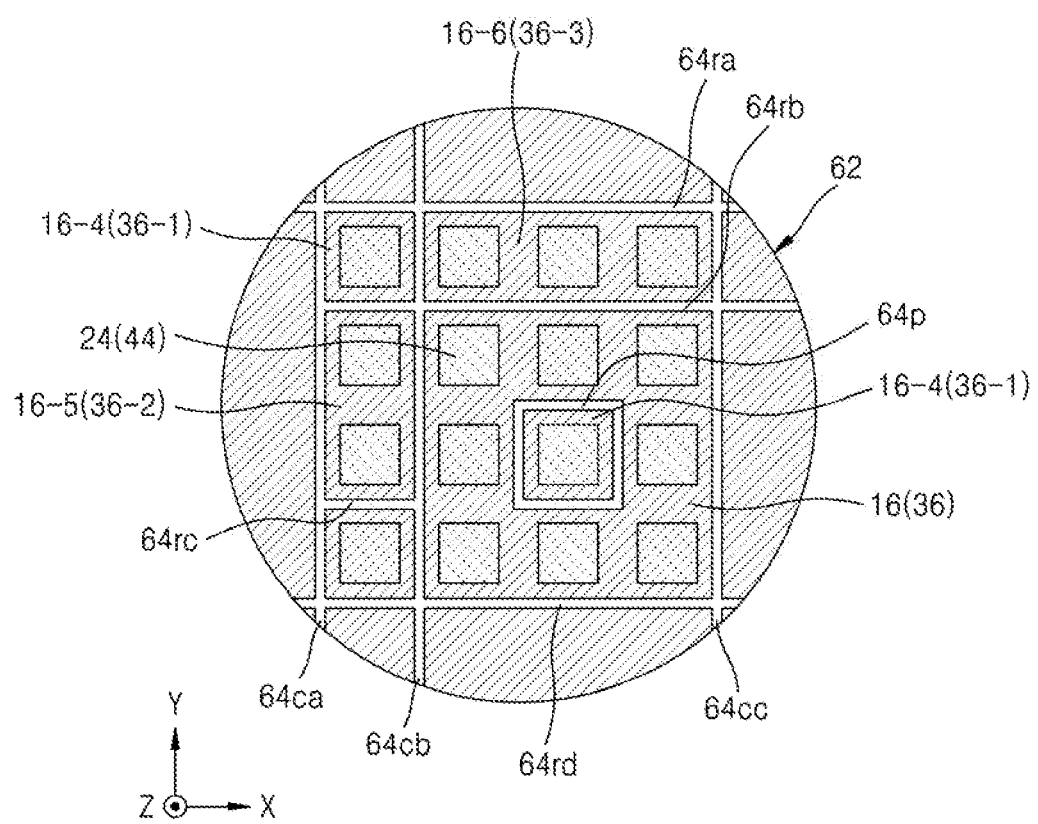
FIG. 9 is a diagram of wafer dicing lines for forming a die constituting a semiconductor package, according to an embodiment.

FIG. 9 is a diagram showing wafer dicing lines for forming a die constituting a semiconductor package according to an embodiment.

FIG. 9 shows wafer dicing lines 64ra, 64rb, 64rc, 64rd, 64ca, 64cb, 64cc, and 64p for forming the above-described dies (16 of FIGS. 1 through 3 and 36 of FIGS. 5 through 7).

A plurality of unit chips 24(44) may be on a wafer 62 in the X and Y directions. Each of the unit chips 24(44) may be an integrated circuit device or a passive element. The passive element may be a decoupling capacitor.

The wafer 62 may be diced along the wafer dicing lines 64ra, 64rb, 64rc, 64rd, 64ca, 64cb, 64cc, and 64p to form dies 16(36), 16-4(36-1), 16-5 (36-2), and 16-6(36-3). The wafer dicing lines 64ra, 64rb, 64rc, 64rd, 64ca, 64cb, 64cc, and 64p may be formed on the wafer 62 through blade cutting, laser irradiation, or plasma irradiation.

In an implementation, the wafer dicing lines 64rb, 64rd, 64cb, 64cc, and 64p may be formed by dicing the wafer 62 using a blade cutting method, a laser irradiation method, or a plasma irradiation method.

In an implementation, when the wafer 62 is diced along the wafer dicing lines 64ra, 64rb, 64ca, 64cb, 64cc, and 64p, the die 16(36) may be formed to have eight unit chips 24(44) and the die-through region 21(41) at a central portion thereof.

In an implementation, when the wafer 62 is diced along the wafer dicing lines 64rb, 64rc, 64ca, and 64cb, the die 16-4 (36-1) having one unit chip 24(44) may be provided.

In an implementation, when the wafer 62 is diced along the wafer dicing lines 64rb, 64rc, 64ca, and 64cb, the die 16-5 (36-2) having two unit chips 24(44) may be provided. In an implementation, when the wafer 62 is diced along the wafer dicing lines 64ra, 64rb, 64cb, and 64cc, the die 16-6(36-3) having three unit chips 24(44) may be provided.

As described above, various types of wafer dicing lines 64ra, 64rb, 64rc, 64rd, 64ca, 64cb, 64cc, and 64p may be formed on the wafer 62 to form various types of dies 16(36), 16-4(36-1), 16-5(36-2), and 16-6(36-3), each including one or a plurality of unit chips 24(44).

Figure 10:
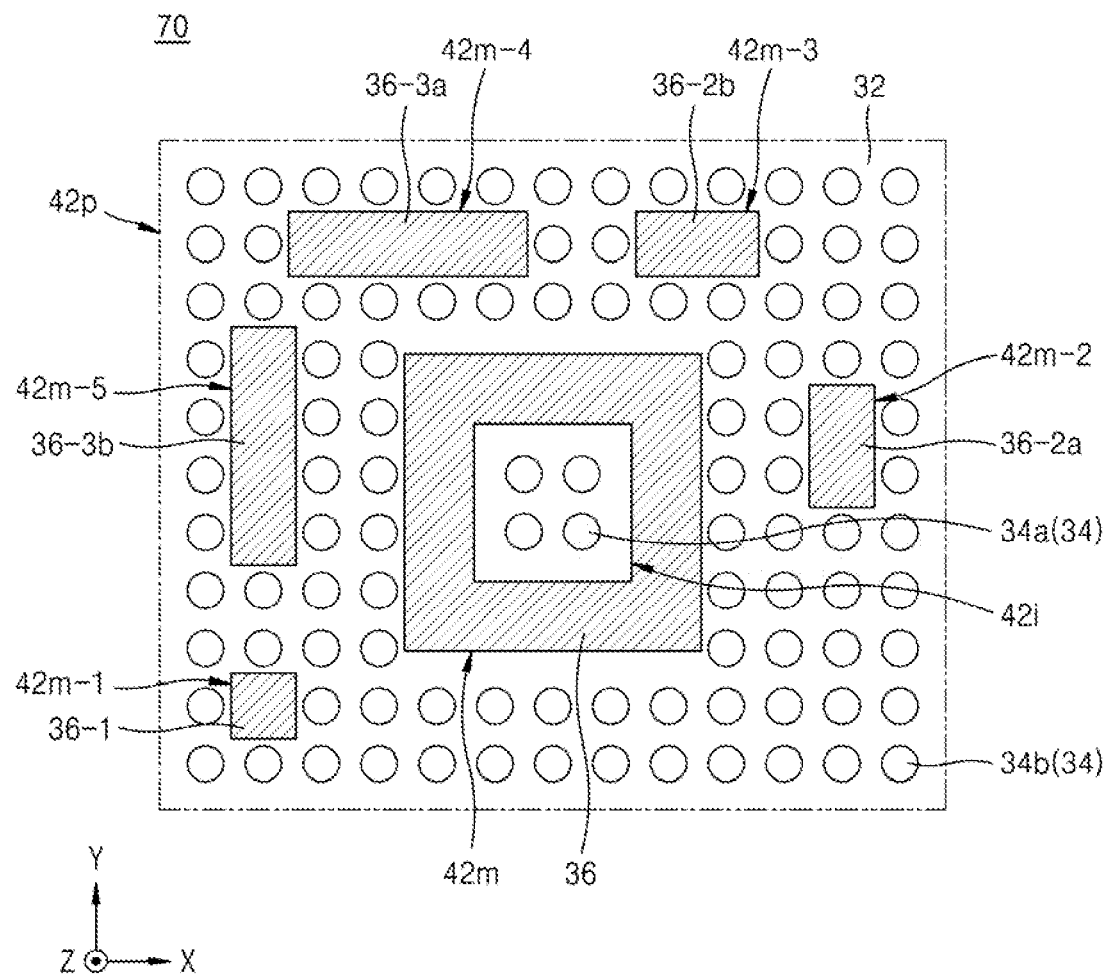
FIG. 10 is a layout diagram of a semiconductor package according to an embodiment.

FIG. 10 is a layout diagram of a semiconductor package 70 according to an embodiment.

In an implementation, the semiconductor package 70 of FIG. 10 may be substantially the same as the semiconductor package 30 of FIGS. 5 through 8 except that the underfill placement region (42o of FIG. 5) may be omitted, and additional dies 36-1, 36-2a, 36-2b, 36-3a, and 36-3b may be respectively arranged on a plurality of additional die mounting regions 42m-1, 42m-2, 42m-3, 42m-4, and 42m-5. The arrangement of the additional dies 36-1, 36-2a, 36-2a, 36-3a, and 36-3b is also applicable to the semiconductor package 10 of FIGS. 1 through 3. In relation to FIG. 10, descriptions that are already provided above with respect to FIGS. 5 through 8 will be briefly presented or omitted.

Like in FIGS. 5 through 8, the semiconductor package 70 may include a circuit board 32. The circuit board 32 may include a first wiring region 42i, a die mounting region 42m surrounding the first wiring region 42i, and a second wiring region 42p surrounding the die mounting region 42m.

A plurality of wiring balls 34 (spaced apart from one another in the X-Y plane) may be on the circuit board 32. The wiring balls 34 may include a plurality of first wiring balls 34a on the first wiring region 42i and a plurality of second wiring balls 34b on the second wiring region 42p.

The additional die mounting regions 42m-1, 42m-2, 42m-3, 42m-4, and 42m-5, which are spaced apart from one another, may be on the second wiring region 42p. In an implementation, as illustrated in FIG. 10, five additional die mounting regions 42m-1, 42m-2, 42m-3, 42m-4, and 42m-5 may be included, or one or more additional die mounting regions may be provided as desired.

The additional dies 36-1, 36-2a, 36-2b, 36-3a, and 36-3b may be respectively arranged on the additional die mounting regions 42m-1, 42m-2, 42m-3, 42m-4, and 42m-5. Each of the additional dies 36-1, 36-2a, 36-2b, 36-3a, and 36-3b may include one additional unit chip or a plurality of spaced-apart additional unit chips, e.g., two to three additional unit chips. As described above, an additional unit chip may be an integrated circuit device or a passive element.

Figure 11:
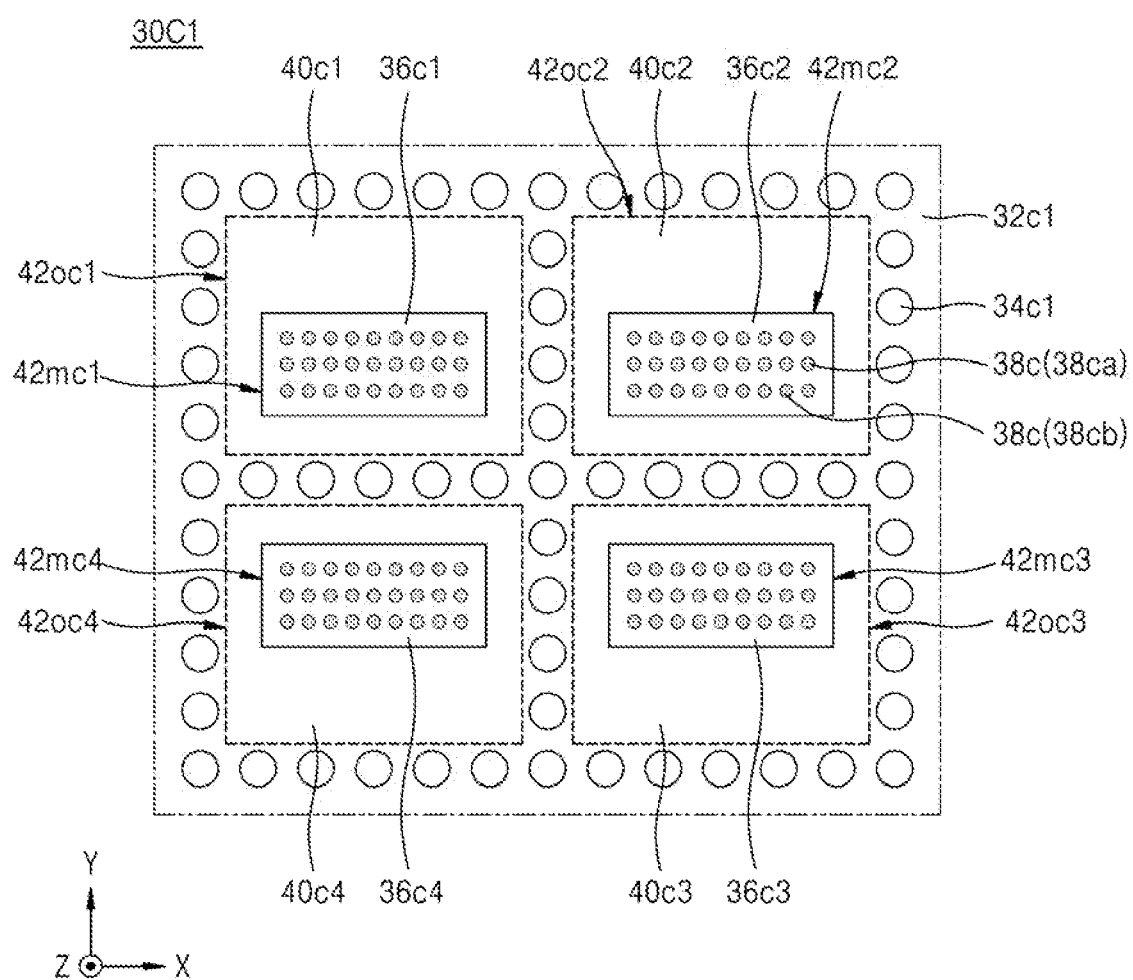
FIGS. 11 and 12 are respectively layout diagrams of first and second comparative semiconductor packages for comparison with a semiconductor package according to an embodiment.
Figure 12:
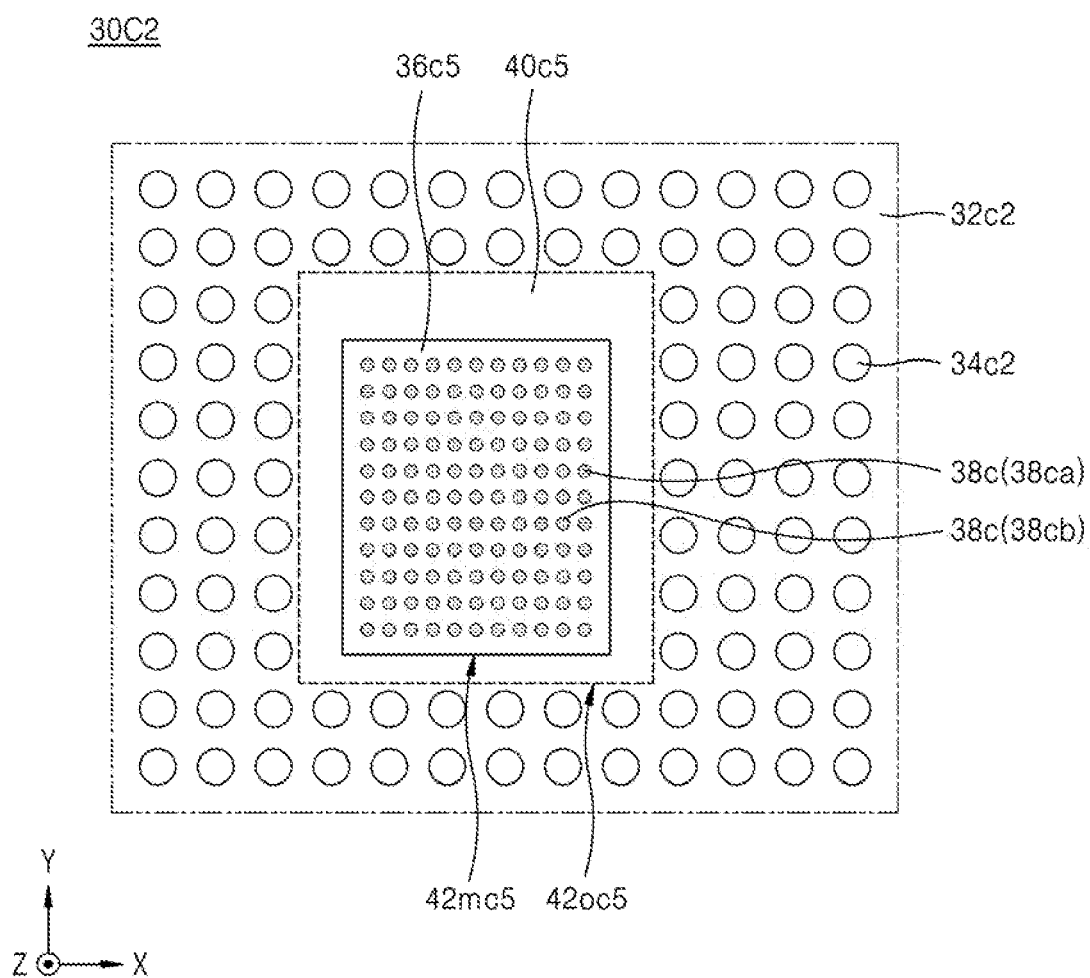

FIGS. 11 and 12 are respectively layout diagrams of first and second comparative semiconductor packages 30C1 and 30C2 for comparison with the semiconductor package 30 according to an embodiment.

FIGS. 11 and 12 are respectively layout diagrams of the first comparative semiconductor package 30C1 and the second comparative semiconductor package 30C2 for comparison with the semiconductor package 30 of FIGS. 5 through 8.

The first comparative semiconductor package 30C1 may include four dies 36c1, 36c2, 36c3, and 36c4 spaced apart from one another. The first comparative semiconductor package 30C1 may include a circuit board 32c1, a plurality of wiring balls 34c1, the four dies 36c1, 36c2, 36c3, and 36c4, die balls 38c on each of the dies 36c1, 36c2, 36c3, and 36c4, and underfill materials 40c1, 40c2, 40c3, and 40c4 respectively surrounding the dies 36c1, 36c2, 36c3, and 36c4. The circuit board 32c1 may correspond to the circuit board 32 of FIG. 5. The wiring balls 34c1 may correspond to the wiring balls 34 of FIG. 5.

The first comparative semiconductor package 30C1 may include die mounting regions 42mc1, 42mc2, 42mc3, and 42mc4 spaced apart from one another. The dies 36c1, 36c2, 36c3, and 36c4 may be respectively on the die mounting regions 42mc1, 42mc2, 42mc3, and 42mc4. Die balls 38 including first die balls 38ca and a plurality of second die balls 38cb may be on each of the dies 36c1, 36c2, 36c3, and 36c4. The first die balls 38ca may be power connecting balls, and the second die balls 38cb may be ground connecting balls.

The first comparative semiconductor package 30C1 may include underfill placement regions 42oc1, 42oc2, 42oc3, and 42oc4 respectively surrounding the die mounting regions 42mc1, 42mc2, 42mc3, and 42mc4. The underfill materials 40c1, 40c2, 40c3, and 40c4 may be respectively on the underfill placement regions 42oc1, 42oc2, 42oc3, and 42oc4.

The second comparative semiconductor package 30C2 may include one die 36c5 having an area larger than that of each of the dies 36c1, 36c2, 36c3, and 36c4 in the first comparative semiconductor package 30C1. The second comparative semiconductor package 30C2 may include a circuit board 32c2, a plurality of wiring balls 34c2, the die 36c5, die balls 38c positioned on the die 36c5, and an underfill material 40c5 surrounding the die 36c5. The circuit board 32c2 may correspond to the circuit board 32 of FIG. 5. The wiring balls 34c2 may correspond to the wiring balls 34 of FIG. 5.

The second comparative semiconductor package 30C2 may include one die mounting region 42mc5. The die 36c5 may be on the die mounting region 42mc5. The die balls 38c including the first and second die balls 38ca and 38cb may be on the die 36c5. The first die balls 38ca may be power connecting balls, and the second die balls 38cb may be ground connecting balls.

The second comparative semiconductor package 30C2 may include an underfill placement region 42oc5 surrounding the die mounting region 42mc5. The underfill material 40c5 may be on the underfill placement region 42oc5.

Figure 13:
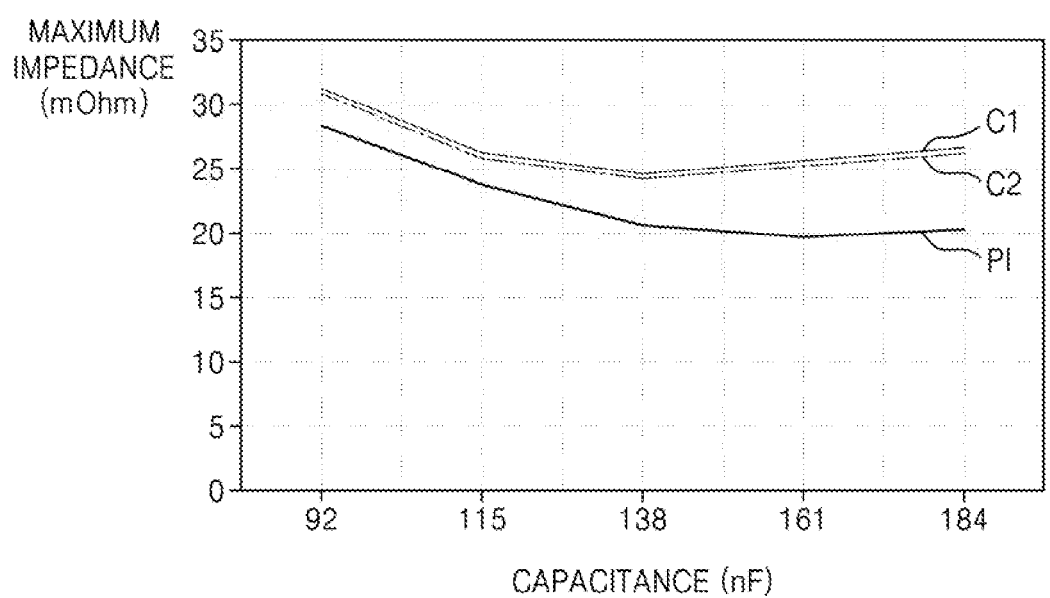
FIG. 13 is a graph showing power integrity (PI) characteristics of a semiconductor package according to an embodiment and a semiconductor package according to a comparative example.

FIG. 13 is a graph showing describing PI characteristics of a semiconductor package according to an embodiment and comparative semiconductor packages according to comparative examples.

FIG. 13 is a diagram for comparing PI characteristics of the semiconductor package 30 of FIGS. 5 through 8 with PI characteristics of the first and second comparative semiconductor packages 30C1 and 30C2 according to the comparative examples of FIGS. 11 and 12. FIG. 13 is a diagram showing a result of comparing PI characteristics of power transmitted to the third central die ball 54c of FIG. 8 at the central portion.

In FIG. 13, reference numeral C1 denotes characteristics of the first comparative semiconductor package 30C1 shown in FIG. 11. Reference numeral C2 denotes characteristics of the second comparative semiconductor package 30C2 shown in FIG. 12. Reference numeral PI denotes characteristics of the semiconductor package 30 of FIGS. 5 through 8 according to an embodiment.

As seen on FIG. 13, the semiconductor package 30 according to an embodiment exhibited a lower maximum impedance and thus better PI characteristics than the first and second comparative semiconductor packages 30C1 and 30C2.

Figure 14:
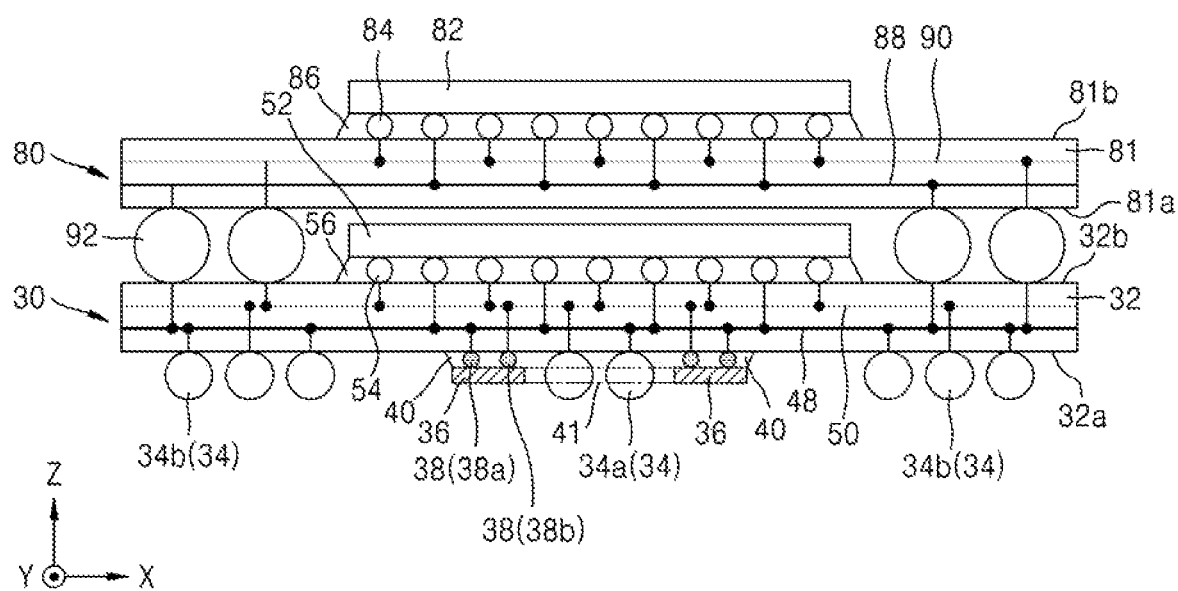
FIG. 14 is a cross-sectional view of a semiconductor package according to an exemplary embodiment.

FIG. 14 is a cross-sectional view of a semiconductor package 100 according to an embodiment.

In the semiconductor package 100, a second semiconductor package 80 may be mounted on a first semiconductor package 30. The first semiconductor package 30 in FIG. 14 may correspond to the semiconductor package 30 of FIGS. 5 through 8. The first semiconductor package 30 may be a package in which the molding material (60 of FIG. 7) is omitted. In relation to FIG. 14, descriptions that are already provided above with respect to FIGS. 5 through 8 may be briefly presented or omitted.

The semiconductor package 100 may be a stacked package-on-package package in which the second semiconductor package 80 is vertically stacked on the first semiconductor package 30. In the semiconductor package 100, third wiring balls 92 may be on the second wiring surface 32b of the circuit board 32. The third wiring balls 92 may be near two opposite edges of the second wiring surface 32b of the circuit board 32.

A second circuit board 81 may be mounted on the third wiring balls 92. The second circuit board 81 may have a third wiring surface 81a and a fourth wiring surface 81b opposite to the third wiring surface 81a. A third die 82 electrically coupled by fourth die balls 84 may be mounted on the fourth wiring surface 81b of the second circuit board 81.

The fourth die balls 84 may be electrically connected to a power wiring line 88, a ground wiring line 90, or a signal wiring line located in the second circuit board 81. An underfill material 86 may be between the fourth die balls 84 on the third wiring surface 81a of the second circuit board 81. In an implementation, a second die 36 may be a logic device. The third die 82 may be a memory device. Descriptions of examples of the logic device or memory device are already provided above, and thus, may not be repeated.

Figure 15:
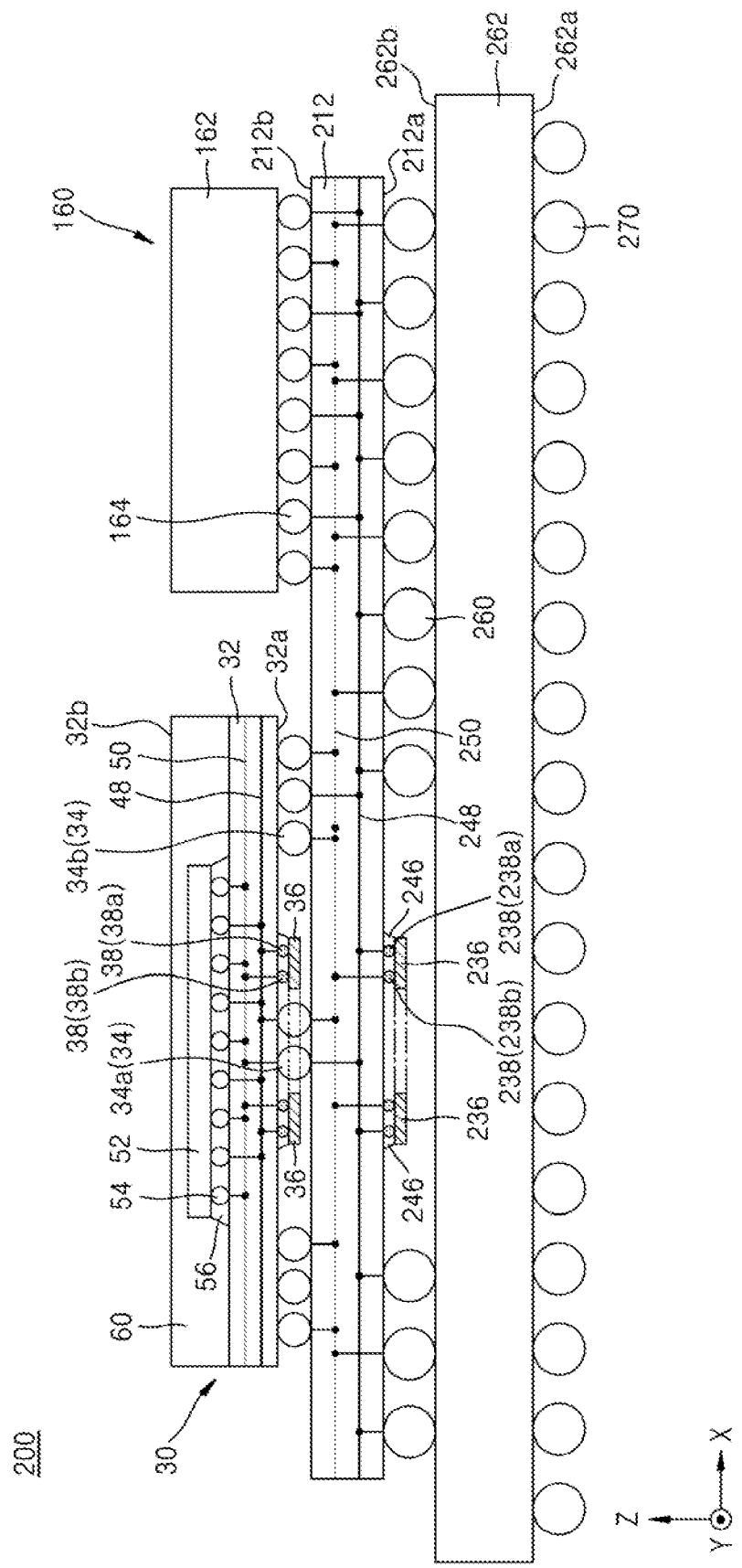
FIG. 15 is a cross-sectional view of a semiconductor package according to an embodiment.

FIG. 15 is a cross-sectional view of a semiconductor package 200 according to an embodiment.

In an implementation, the semiconductor package 200 may be a system package including a main circuit board 262, an interposer substrate 212, a first semiconductor package 30, and a second semiconductor package 160. The semiconductor package 200 may include the first semiconductor package 30 and the second semiconductor package 160 that are mounted on the interposer substrate 212 so that they are separated from each other in a horizontal direction, e.g., in an X direction.

The main circuit board 262 may include a first main wiring surface 262a and a second main wiring surface 262b opposite to the first main wiring surface 262a. The main circuit board 262 may be a PCB. Main wiring balls 270 may be on the first main wiring surface 262a of the main circuit board 262 and connected to an external device.

The interposer substrate 212 may be on fourth wiring balls 260. The interposer substrate 212 may include a fifth wiring surface 212a and a sixth wiring surface 212b opposite to the fifth wiring surface 212a. A power (power supply) wiring line 248, a ground (earth) wiring line 250, or a signal wiring line may be inside the interposer substrate 212.

The fourth wiring balls 260 (for electrically connecting the main circuit board 262 to the interposer substrate 212) may be on the fifth wiring surface 212a of the interposer substrate 212. The fourth wiring balls 260 may be electrically connected to the power (power supply) wiring line 248, the ground (earth) wiring line 250, or the signal wiring line inside the interposer substrate 212. A fourth die 236 may be attached to the fifth wiring surface 212a by an underfill material 246. The fourth die 236 may correspond to the die 36 of FIGS. 5 through 8.

The first semiconductor package 30 may be mounted on the sixth wiring surface 212b of the interposer substrate 212. The first semiconductor package 30 may correspond to the semiconductor package 30 of FIGS. 5 through 8. The first semiconductor package 30 may be electrically connected to the interposer substrate 212 via the wiring balls 34.

The second semiconductor package 160 may be mounted on the sixth wiring surface 212b of the interposer substrate 212 and separated from the first semiconductor package 30. The second semiconductor package 160 may be a memory semiconductor package. The second semiconductor package 160 may include a fifth die 162 and fifth wiring balls 164. The fifth die 162 may be a memory device.

The second semiconductor package 160 may be electrically connected to the interposer substrate 212 via the fifth wiring balls 164. The fifth wiring balls 164 may be electrically connected to the power (power supply) wiring line 248 and the ground (earth) wiring line 250 in the interposer substrate 212.

Figure 16:
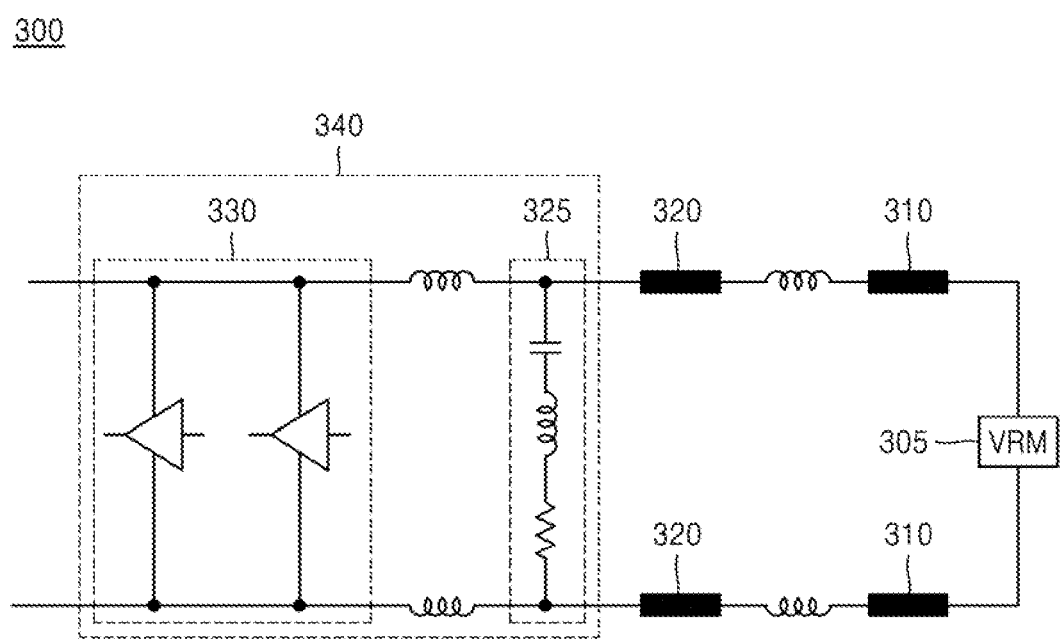
FIG. 16 is a schematic circuit diagram of a semiconductor package according to an embodiment.

FIG. 16 is a schematic circuit diagram 300 of a semiconductor package according to an embodiment.

In an implementation, the circuit diagram 300 may include a semiconductor package 340 including a first die 325 and a second die 330, a first power and ground network 310, a second power and ground network 320, and a voltage regulation module (VRM) 305. In an embodiment, the first die 325 may be a passive element, such as a decoupling capacitor element. The second die 330 may be an integrated circuit device.

The VRM 305 may adjust power supplied to the semiconductor package 340 to a preset level of power suitable for the first or second die 325 or 330. A voltage regulating function may be achieved by passing a voltage through several filter elements including passive and active filter elements. A voltage is supplied to an internal circuit of the second die 330 via the VRM 305, and voltage noise may be reduced via a passive element constituting the first die 325, such as a decoupling capacitor.

The voltage from the VRM 305 may pass through the first power and ground network 310 of the main circuit board (e.g., 262 of FIG. 15) and then the second power and ground network 320 of the circuit board (32 of FIG. 7) into the second die 330. The second power and ground network 320 may correspond to the power wiring line 48 and the ground wiring line 50 of FIG. 7.

An inductor on the circuit diagram 300 represents an inductance of a wire or conductive bump. Inductors may be between the first power and ground network 310 of the main circuit board (e.g., 262 of FIG. 15) and the second power and ground network 320 of the circuit board (e.g., 32 of FIG. 7) and between the second power and ground network 320 and the second die 330.

A passive element of the first die 325, e.g., a decoupling capacitor, may have a form in which an inductance and a resistance, which are unwanted parasitic components, as well as capacitance are connected in series. A parasitic inductance component may also exist on a path between the first die 325 that is a passive element and the second die 330, and accordingly, the farther the first die 325 is from the second die 330, the lower the percentage of high-frequency noise may be removed.

In the semiconductor package 340 according to an embodiment, the first die 325 (that is a passive element) may be adjacent to the second die 330 to maintain a constant percentage of high-frequency noise removal, thereby improving PI characteristics.

FIGS. 17A through 17H are cross-sectional views of stages in a method of forming a die constituting a semiconductor package, according to an embodiment.

FIGS. 17A through 17H illustrate stages in a method of forming a plurality of dies (DI1, DI2, and DI3 of FIG. 17H) separated from one another by dicing a wafer 400 using a plasma irradiation method, e.g., a plasma dicing method.

Figure 17A:
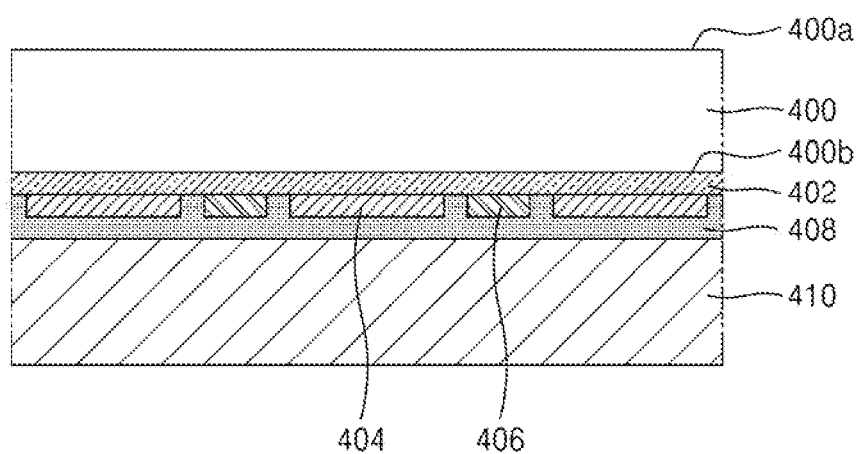
FIGS. 17A through 17H are cross-sectional views of stages in a method of forming a die constituting a semiconductor package, according to an embodiment.

Referring to FIG. 17A, after an insulating layer 402 is formed on an upper surface 400b of the wafer 400, a device-forming layer 404 and a test circuit layer 406 may be formed on the insulating layer 402. The wafer 400 may have the upper surface 400b (or front surface) and a lower surface 400a (or rear surface) opposite to the upper surface 400b. The wafer 400 may correspond to the wafer 62 of FIG. 9. FIG. 17A shows that the lower surface 400a of the wafer 400 faces upward.

The device-forming layer 404 may be a material layer for forming an integrated circuit device or a passive element. The test circuit layer 406 may be a material layer for testing at least one device. A carrier substrate 410 may be attached via an adhesive layer 408 to the upper surface 400b of the wafer 400 on which the device-forming layer 404 and the test circuit layer 406 have been formed.

Figure 17B:
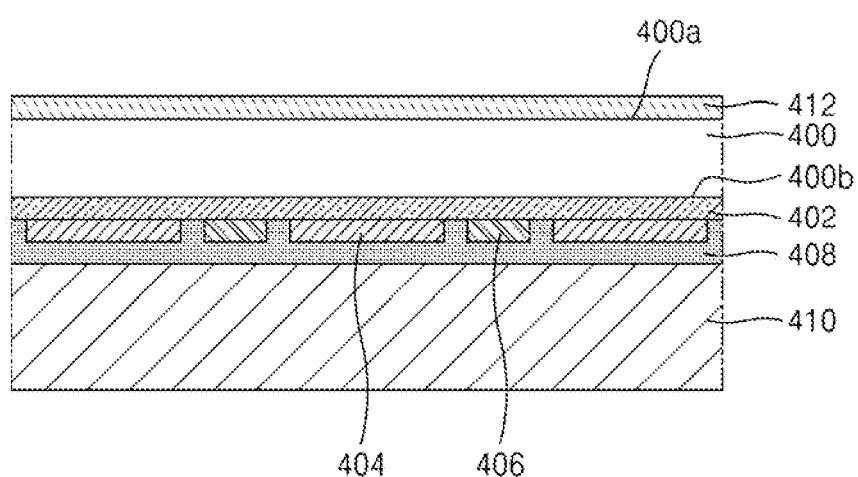
Figure 17C:
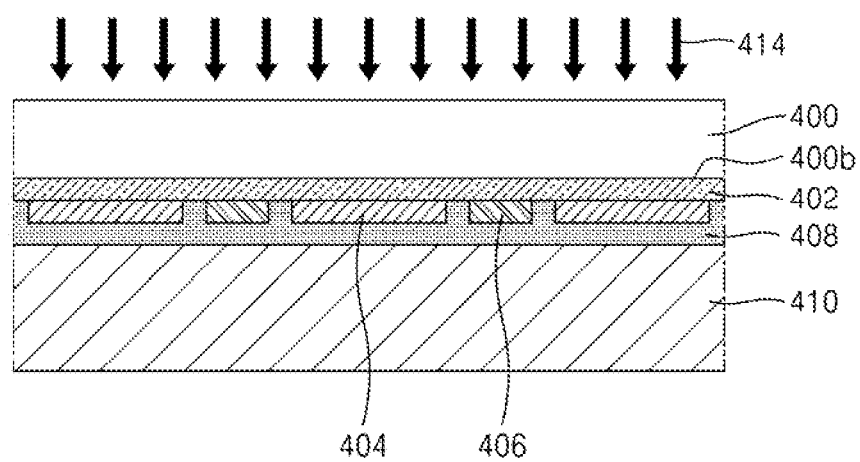

Referring to FIGS. 17B and 17C, a thickness of the wafer 400 may be reduced by grinding the lower surface 400a of the wafer 400 as shown in FIG. 17B. During grinding of the wafer 400, a wafer damage layer 412 may be generated on the lower surface 400a of the wafer 400.

In an implementation, as shown in FIG. 17C, plasma 414, e.g., gas plasma containing sulfur hexafluoride ($SF_6$), may be applied to the lower surface 400a of the wafer 400 to remove the wafer damage layer 412.

Figure 17D:
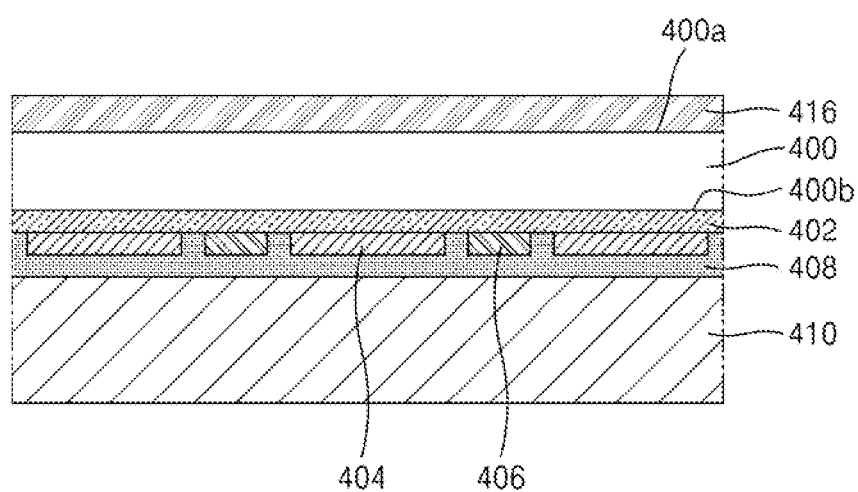
Figure 17E:
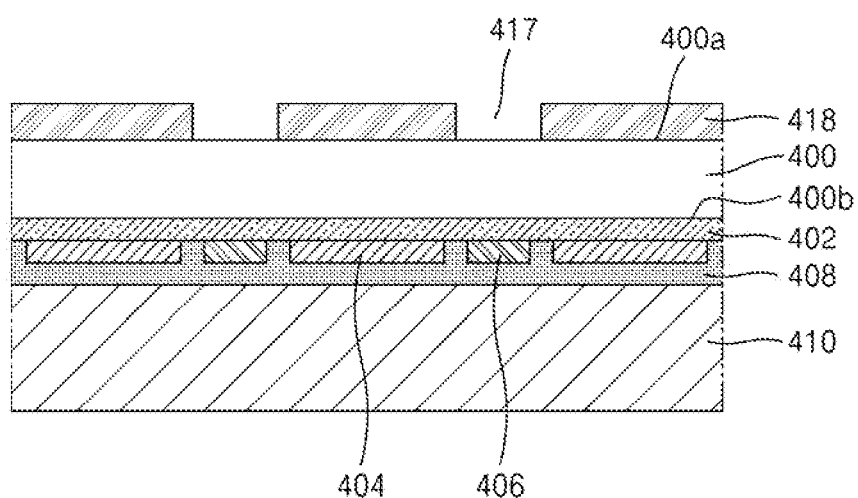

Referring to FIGS. 17D and 17E, a photoresist layer 416 may be formed on the lower surface 400a of the wafer 400 as shown in FIG. 17D. Subsequently, as shown in FIG. 17E, the photoresist layer 416 may be patterned using a photolithography process to form a photoresist pattern 418. The photoresist pattern 418 may expose a region 417 of the lower surface 400a of the wafer 400 overlying the test circuit layer 406.

Figure 17F:
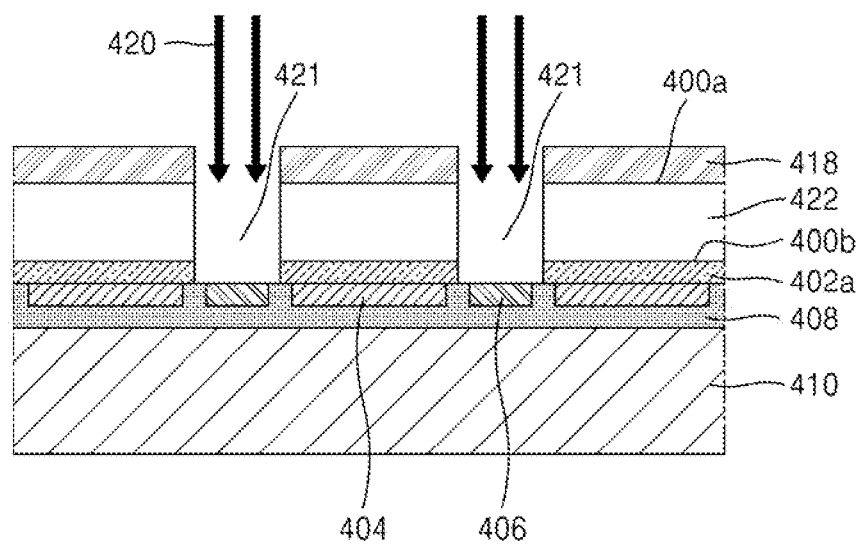
Figure 17G:
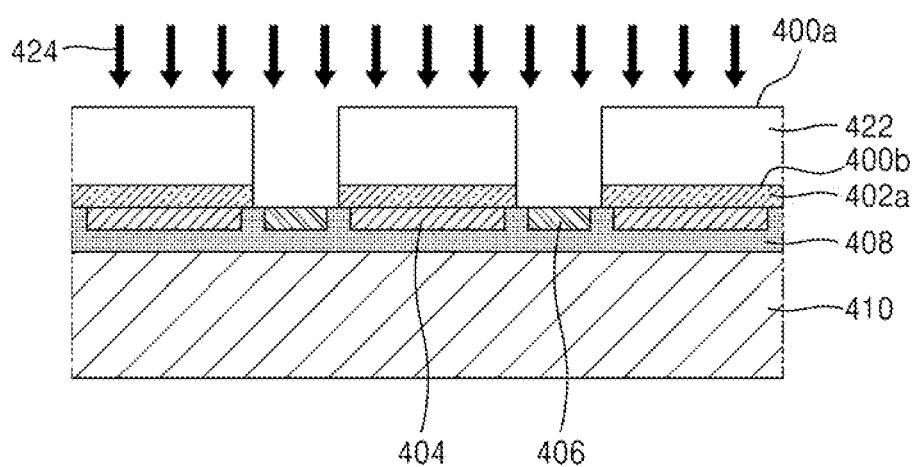

Referring to FIGS. 17F and 17G, the region 417 of the wafer 400 and a corresponding region of the insulating layer 402 may be etched by using the photoresist pattern 418 as an etch mask together with application of the plasma 420, e.g., gas plasma containing $SF_6$, as shown in FIG. 17F. The etching may be performed as described above to form a wafer pattern 422 and an insulating pattern 402a having a through hole 421 exposing the test circuit layer 406.

Subsequently, as shown in FIG. 17G, the photoresist pattern 418 may be removed using plasma ashing 424 such as oxygen plasma ashing. As a result of the plasma ashing 424, the wafer pattern 422, e.g., the lower surface 400a of the wafer 400, may be exposed to outside.

Figure 17H:
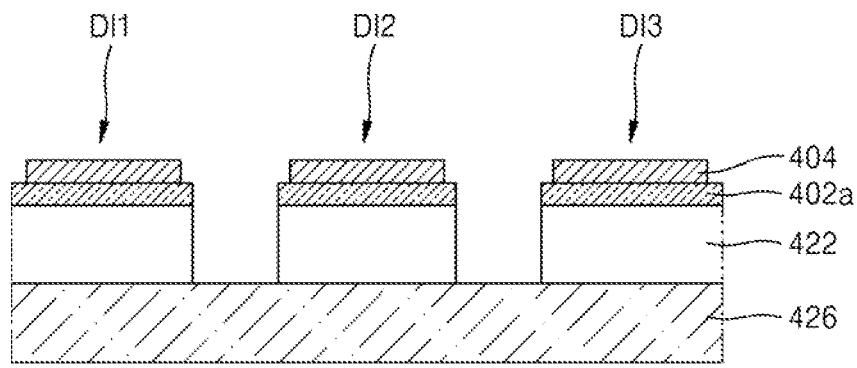

Referring to FIG. 17H, a mounting tape 426 may be applied over the lower surface 400a of the wafer 400 to detach the wafer pattern 422 and the insulating pattern 402a. In this way, the dies DI1, DI2, and DI3 separated from one another may be provided on the mounting tape 426.

Each of the dies DI1, DI2, and DI3 may include the wafer pattern 422 and the insulating pattern 402a. The dies DI1, DI2, and DI3 may correspond to the dies 16(36), 16-4 (36-1), 16-5(36-2), and 16-6(36-3) of FIG. 9. Each of the dies DI1, DI2, and DI3 may include one or a plurality of unit chips.

By way of summation and review, if a large amount of noise were to be transmitted to a die due to poor PI characteristics, the semiconductor package could malfunction or suffer performance degradation or a shorter lifespan.

One or more embodiments may provide a semiconductor package capable of improving power integrity (PI) characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
    a circuit board including a first wiring region, a die mounting region surrounding the first wiring region, and a second wiring region surrounding the die mounting region;
    a plurality of wiring balls on the first wiring region and the second wiring region and spaced apart from one another, the plurality of wiring balls including a plurality of first wiring balls on the first wiring region and a plurality of second wiring balls on the second wiring region; and
    a die having a first height and disposed on the die mounting region, the die including:
        a first surface and a second surface opposite to the first surface;
        a plurality of unit chips spaced apart from one another, and
        a die-through region corresponding to the first wiring region and exposing the plurality of first wiring balls; and
        a plurality of die balls on the first surface of the die and the die mounting region, the plurality of die balls being spaced apart from one another and electrically coupled to the circuit board,
    wherein the plurality of first wiring balls each have a second height that is greater than the first height of the die, and
    wherein the plurality of first wiring balls extend through the die-through region such that a first portion of each of the first wiring balls is disposed above the first surface of the die and a second portion of each of the first wiring balls is disposed below the second surface of the die.

2. The semiconductor package as claimed in claim 1, wherein the circuit board includes a printed circuit board (PCB) or an interposer substrate.

3. The semiconductor package as claimed in claim 1, wherein each unit chip of the plurality of unit chips of the die includes an integrated circuit device.

4. The semiconductor package as claimed in claim 1, wherein each unit chip of the plurality of unit chips of the die includes a passive element including a decoupling capacitor.

5. The semiconductor package as claimed in claim 1, wherein:
    the die includes a die body region and the die-through region within the die body region, and
    the die body region and the die-through region each have a circular shape and together form a doughnut-shaped region.

6. The semiconductor package as claimed in claim 1, wherein:
    the die includes a die body region and the die-through region within the die body region, and
    the die body region and the die-through region each have a polygonal shape.

7. The semiconductor package as claimed in claim 1, wherein the plurality of first wiring balls are electrically connected to a power wiring line or ground wiring line in the circuit board.

8. The semiconductor package as claimed in claim 1, wherein:
    a pitch of the plurality of first wiring balls is greater than a pitch of the plurality of die balls, and
    a pitch of the plurality of second wiring balls is greater than the pitch of the plurality of die balls.

9. The semiconductor package as claimed in claim 1, wherein the second wiring region further includes an additional die mounting region including an additional die thereon, the additional die including one additional unit chip or a plurality of spaced-apart additional unit chips.

10. A semiconductor package, comprising:
    a circuit board including a first wiring region, a die mounting region surrounding the first wiring region, an underfill placement region surrounding the first wiring region and the die mounting region, and a second wiring region surrounding the underfill placement region;
    a plurality of wiring balls on the first wiring region and the second wiring region and spaced apart from one another, the plurality of wiring balls including a plurality of first wiring balls on the first wiring region and a plurality of second wiring balls on the second wiring region; and
    a die having a first height and disposed on the die mounting region, the die including:
        a first surface and a second surface opposite to the first surface;
        a plurality of unit chips spaced apart from one another, each unit chip of the plurality of unit chips including a passive element having a decoupling capacitor, and
        a die-through region corresponding to the first wiring region and exposing the plurality of first wiring balls; and
        a plurality of die balls on the first surface of the die and on the die mounting region, the plurality of die balls being spaced apart from one another and electrically coupled to the circuit board,
    wherein the plurality of first wiring balls each have a second height that is greater than the first height of the die, and
    wherein the plurality of first wiring balls extend through the die-through region such that a first portion of each of the first wiring balls is disposed above the first surface of the die and a second portion of each of the first wiring balls is disposed below the second surface of the die.

11. The semiconductor package as claimed in claim 10, wherein an area of the first wiring region is less than an area of the die mounting region.

12. The semiconductor package as claimed in claim 10, wherein outermost edges of the underfill placement region are spaced different distances from facing outermost edges of the die mounting region.

13. The semiconductor package as claimed in claim 10, wherein:
- the die includes a die body region and the die-through region within the die body region, and
- the die body region and the die-through region each have a polygonal shape.

14. The semiconductor package as claimed in claim 10, wherein:
- the die includes a die body region and the die-through region within the die body region, and
- the die body region and the die-through region each have a circular shape and together have a doughnut shape.

15. The semiconductor package as claimed in claim 10, wherein the plurality of first wiring balls are electrically connected to a power wiring line or ground wiring line in the circuit board.

16. A semiconductor package, comprising:
- a circuit board having a first wiring surface and a second wiring surface opposite to the first wiring surface, the circuit board including a first wiring region on the first wiring surface, a die mounting region surrounding the first wiring region, an underfill placement region surrounding the first wiring region and the die mounting region, and a second wiring region surrounding the underfill placement region;
- a plurality of wiring balls on the first wiring surface and spaced apart from one another, the plurality of wiring balls including a plurality of first wiring balls on the first wiring region and a plurality of second wiring balls on the second wiring region, the plurality of wiring balls being electrically connected to a power wiring line or ground wiring line;
- a first die having a first height, a first die surface corresponding to the first wiring surface and a second die surface opposite to the first die surface and on the die mounting region, the first die including a plurality of unit chips spaced apart from one another and a die-through region corresponding to the first wiring region and exposing the plurality of first wiring balls;
- a plurality of first die balls on the first die surface and spaced apart from one another, the plurality of first die balls being electrically coupled to the circuit board; and
- a second die on the second wiring surface and electrically coupled to the circuit board via a plurality of second die balls,
- wherein the plurality of first wiring balls each have a second height that is greater than the first height of the first die, and
- wherein the plurality of first wiring balls extend through the die-through region such that a first portion of each of the first wiring balls is disposed above the first die surface of the first die and a second portion of each of the first wiring balls is disposed below the second die surface of the first die.

17. The semiconductor package as claimed in claim 16, wherein:
- the circuit board includes a printed circuit board (PCB) or an interposer substrate, and
- each of the plurality of unit chips includes a passive element having a decoupling capacitor.

18. The semiconductor package as claimed in claim 16, wherein:
- an area of the first wiring region is less than an area of the die mounting region, and
- the die-through region is a region penetrating between the first die surface and the second die surface.

19. The semiconductor package as claimed in claim 16, wherein:
- the first wiring surface and the second wiring surface respectively include a lower surface and an upper surface of the circuit board, and
- the first die surface and the second die surface are respectively a lower surface and an upper surface of the first die.

20. The semiconductor package as claimed in claim 16, wherein:
- the first die includes a die body region and the die-through region within the die body region, and
- the die body region and the die-through region each have a polygonal shape or a circular shape.

* * * * *